(12) United States Patent
Tsai et al.

(10) Patent No.: US 12,349,492 B2
(45) Date of Patent: Jul. 1, 2025

(54) PHOTODIODE STRUCTURE FOR IMAGE SENSOR

(71) Applicant: Taiwan Semiconductor Manufacturing Co., Ltd., Hsinchu (TW)

(72) Inventors: Min-Ying Tsai, Kaohsiung (TW); Ching I Li, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 240 days.

(21) Appl. No.: 17/217,026

(22) Filed: Mar. 30, 2021

(65) Prior Publication Data
US 2022/0320154 A1 Oct. 6, 2022

(51) Int. Cl.
*H10F 39/00* (2025.01)
*H10F 39/18* (2025.01)

(52) U.S. Cl.
CPC ......... *H10F 39/807* (2025.01); *H10F 39/011* (2025.01); *H10F 39/18* (2025.01); *H10F 39/811* (2025.01)

(58) Field of Classification Search
CPC ........... H01L 27/1463; H01L 27/14636; H01L 27/14643; H01L 27/14683
See application file for complete search history.

(56) References Cited

U.S. PATENT DOCUMENTS

| | | | |
|---|---|---|---|
| 2006/0138494 A1* | 6/2006 | Lee | H01L 31/103 257/292 |
| 2013/0249033 A1* | 9/2013 | Kim | H01L 31/02327 257/447 |
| 2019/0096929 A1* | 3/2019 | Chiang | H01L 27/14612 |
| 2019/0165018 A1* | 5/2019 | Park | H01L 27/14614 |

(Continued)

FOREIGN PATENT DOCUMENTS

| | | |
|---|---|---|
| CN | 112530986 A | 3/2021 |
| TW | 202107722 A | 2/2021 |

OTHER PUBLICATIONS

Non-Final Office Action dated Aug. 8, 2024, for U.S. Appl. No. 18/366,806.

(Continued)

*Primary Examiner* — Jay C Kim
*Assistant Examiner* — Woo K Lee
(74) *Attorney, Agent, or Firm* — Eschweiler & Potashnik, LLC

(57) ABSTRACT

The present disclosure relates to an image sensor having an epitaxial deposited photodiode structure surrounded by an isolation structure, and an associated method of formation. In some embodiments, a first epitaxial deposition process is performed to form a first doped EPI layer over a substrate. The first doped EPI layer is of a first doping type. Then, a second epitaxial deposition process is performed to form a second doped EPI layer on the first doped EPI layer. The second doped EPI layer is of a second doping type opposite from the first doping type. Then, an isolation structure is (Continued)

formed to separate the first doped EPI layer and the second doped EPI layer as a plurality of photodiode structures within a plurality of pixel regions. The plurality of photodiode structures is configured to convert radiation that enters from a first side of the image sensor into an electrical signal.

20 Claims, 18 Drawing Sheets

(56) References Cited

U.S. PATENT DOCUMENTS

| | | |
|---|---|---|
| 2020/0066768 A1 | 2/2020 | Cheng et al. |
| 2021/0111201 A1 | 4/2021 | Li et al. |
| 2021/0242254 A1 | 8/2021 | Fukui |
| 2021/0327940 A1* | 10/2021 | Izukashi ........... H01L 27/14685 |

OTHER PUBLICATIONS

Final Office Action dated Dec. 18, 2024, for U.S. Appl. No. 18/366,806.

Notice of Allowance dated Mar. 26, 2025 for U.S. Appl. No. 18/366,806.

* cited by examiner

PHOTODIODE STRUCTURE FOR IMAGE SENSOR

BACKGROUND

Many modern day electronic devices comprise optical imaging devices (e.g., digital cameras) that use image sensors. An image sensor may include an array of pixel regions and supporting logic. The pixel regions respectively comprise a photodiode structure to measure incident radiation (e.g., light) and convert to electronic data, and the supporting logic facilitates readout of the measurements.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
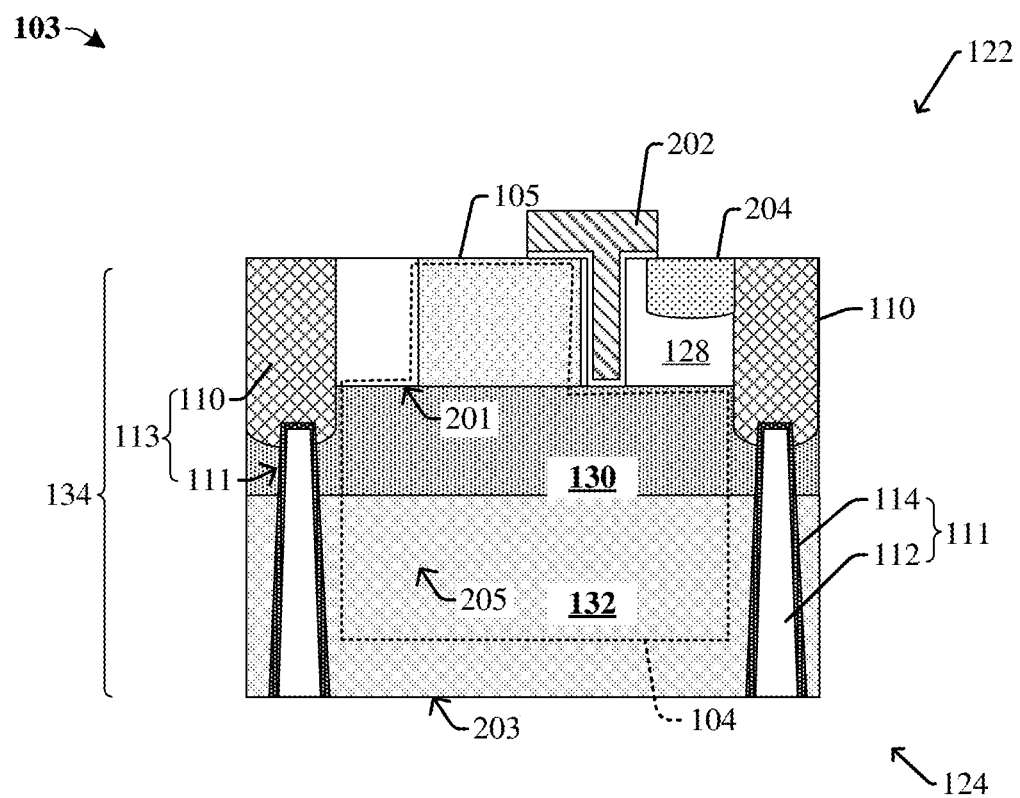
FIG. 1 illustrates a cross-sectional view of some embodiments of a pixel region of an image sensing die comprising an epitaxial deposited photodiode structure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated circuit (IC) technologies are constantly being improved. Such improvements frequently involve scaling down device geometries to achieve lower fabrication costs, higher device integration density, higher speeds, and better performance. Device dimensions of pixel regions of an image sensor may be changed to have smaller pixel sizes due to device scaling and greater vertical thickness to achieve desired full well capacity. The device dimension change brings challenges for photodiode implantation processes to form deep implant wells and photodiode regions. Besides high fabrication complexity and cost, these implantation processes involve a thick photoresist layer which reduces exposure resolution. For example, if the critical dimension is smaller than 0.2 μm, a precise lithography process is hardly achievable with a photoresist layer greater than 3 μm.

In view of the above, the present disclosure relates to an image sensor comprising an epitaxial deposited photodiode, and an associated method of formation. In some embodiments, the image sensor has a plurality of pixel regions of image sensing cells. The image sensor comprises a first doped EPI layer of a first doping type and a second doped EPI layer of a second doping type contacting each other and disposed across the plurality of pixel regions. A plurality of deep trench isolation (DTI) structures is disposed between adjacent pixel regions of the plurality of pixel regions to separate the first doped EPI layer and the second doped EPI layer to a plurality of photodiode structures that configured to convert radiation that enters from a first side of the image sensor into electrical signal. In some embodiments, the second doped EPI layer is formed on the first doped EPI layer by a blanket epitaxial deposition process. Compared to an alternative approach to form a second doped EPI layer deep in a first doped EPI layer by a high energy implantation, processes of photolithography, implantation, and thermal activation can be omitted. And a more uniform and smoother doping profile can be achieved for the formed doped layer with better controllability. Also, full well capacity of the photodiode structures is enlarged by increased photodiode area. Furthermore, as explained in more details later, selection of handling substrate and its removal process is more flexible due to the blanket coverage of the epitaxial process.

FIG. 1 illustrates a cross-sectional view of a pixel region 103 of an image sensing die 134 having an epitaxial deposited photodiode structure 104 according to some embodiments. The photodiode structure 104 is configured to convert incident radiation or incident light (e.g., photons) into an electric signal. The photodiode structure 104 comprises a pair of epitaxial deposited doped regions with opposite doping types such as a first region having a first doping type (e.g., n-type doping by dopants such as phosphorus, arsenic, antimony, etc.) and an adjoining second region having a second doping type (e.g., p-type doping by dopants such as boron, aluminum, indium, etc.) that is opposite from the first doping type. For illustration purposes, embodiments disclosed hereafter use n-type as the first doping type and p-type as the second doping type for various doping layers, but it is understood that using opposite doping types for these doping layers is also within the scope of the disclosure.

The image sensing die 134 has a front-side 122 and a back-side 124. In some embodiments, the photodiode structure 104 comprises an n-type EPI layer 130 (called n-type doped photodiode layer or n-type doped epitaxial layer in some examples) closer to the back-side 124 of the image sensing die 134 and a p-type EPI layer 128 (called p-type doped photodiode layer or p-type doped epitaxial layer in some examples) contacting one side of the n-type EPI layer 130 away from the back-side 124 of the image sensing die 134. The n-type EPI layer 130 and the p-type EPI layer 128 are epitaxial deposited semiconductor layers that are disposed across pixel regions. In some embodiments, an upper doped photodiode region 105 is disposed above the n-type EPI layer 130 and within the p-type EPI layer 128. The upper doped photodiode region 105 may have a bottom surface contacting an upper surface of the n-type EPI layer 130. The upper doped photodiode region 105 may be formed by an implantation process. The epitaxial deposited n-type EPI layer 130 and the implanted upper doped photodiode region 105 collectively work as the first region of the photodiode structure 104 with the first doping type. In some embodiments, the n-type EPI layer 130 has a doping concentration monotonically increasing from the back-side 124 to the front-side 122, while the upper doped photodiode region 105 has a doping concentration that firstly increases then decreases or at least has a wavy trend increasing or decreasing non-monotonically from the back-side 124 to the front-side 122.

In some further embodiments, an n-type doped epitaxial layer 132 may be disposed on one side of the n-type EPI layer 130 opposite from the other side contacting the p-type EPI layer 128. The n-type doped epitaxial layer 132 has a doping concentration smaller than that of the n-type EPI layer 130. The n-type doped epitaxial layer 132 and the n-type EPI layer 130 may have a doping concentration monotonically increasing from the back-side 124 to the front-side 122. More details of the doping concentration including data points 201, 203, and 205 will be discussed associated with FIGS. 2A-2C and FIG. 3. In some embodiments, the n-type doped epitaxial layer 132 is lightly doped n-type layer, the n-type EPI layer 130 is heavily doped n-type layer and the p-type EPI layer 128 is lightly doped p-type layer. As an example, a collective thickness of the n-type EPI layer 130 and the n-type doped epitaxial layer 132 may be in a range between approximately 4 μm and approximately 6 μm, and a concentration of phosphorous can be in a range of from about $1\times10^{15}$ cm$^{-3}$ to about $1\times10^{19}$ cm$^{-3}$. As an example, a thickness of the p-type EPI layer 128 may be around 2 μm, and a concentration of boron can be in a range of from about $1\times10^{13}$ cm$^{-3}$ to about $1\times10^{15}$ cm$^{-3}$.

In some embodiments, the photodiode structure 104 is surrounded, isolated and directly adjoined by an isolation structure 113. The isolation structure 113 comprises a DTI structure 111 extending from the back-side 124 of the image sensing die 134 to a position within or further through the n-type EPI layer 130. In some embodiments, the DTI structure 111 comprises a doped liner 114 with p-type doping and a dielectric fill layer 112. The doped liner 114 lines bottom and sidewall surfaces of the dielectric fill layer 112 and may comprise doped silicon or other doped semiconductor material with boron or other p-type dopants. The doped liner 114 may be disposed in conformal. The dielectric fill layer 112 may be or be comprised of silicon dioxide, silicon nitride, and/or other applicable dielectric material. The doped liner 114 directly contacts the n-type EPI layer 130 and forms a p-n junction with a depletion region at interfaces with the n-type EPI layer 130. Compared to an alternative approach to form the n-type EPI layer 130 deep in p-type EPI layer 128 by a high energy implantation, processes of photolithography, implantation, and thermal activation can be omitted. And a more uniform and smoother doping profile can be achieved for the formed doped layer with better controllability. Also, full well capacity of the photodiode structure 104 is enlarged because the n-type EPI layer 130 is extended to reach the isolation structure 113 and thus forms an increased photodiode area.

In addition, in some embodiments, the isolation structure 113 further comprises a doped shallow isolation well 110 extending from the front-side 122 of the image sensing die 134 to a position within the p-type EPI layer 128 or the n-type EPI layer 130. The doped shallow isolation well 110 may have the second doping type (e.g., p-type doping). In some embodiments, a bottom portion of the DTI structure 111 may be disposed within a recessed lower surface of the doped shallow isolation well 110. The doped shallow isolation well 110 may be vertically aligned with the DTI structure 111 (e.g. sharing a common center line). The DTI structure 111 and the doped shallow isolation well 110 collectively function as an isolation boundary for the pixel region 103 to reduce crosstalk and blooming from other pixel regions. The doped shallow isolation well 110 directly contacts the n-type doped epitaxial layer 132 and/or the n-type EPI layer 130 and forms a p-n junction with a depletion region at interfaces with the n-type doped epitaxial layer 132 and/or the n-type EPI layer 130. The DTI structure 111 and the doped shallow isolation well 110 also collectively facilitate depletion of the photodiode structure 104 during the operation since the DTI structure 111 and the doped shallow isolation well 110 provide additional p-type dopants to the photodiode structure 104, such that full well capacity is further improved.

Though not shown in the figures, in some alternative embodiments, the DTI structures 111 may further extend in vertical depth through the n-type EPI layer 130 and may even extend within or even through the p-type EPI layer 128 (not shown in the figure), such that a complete isolation is achieved. The doped liner 114 and the dielectric fill layer 112 may extend laterally along the back-side 124 of the image sensing die 134.

In some embodiments, a floating diffusion well 204 is doped and disposed from the front-side 122 of the image sensing die 134 to a position within the p-type EPI layer 128. A transfer gate 202 is arranged over the p-type EPI layer 128 at a position laterally between the photodiode structure 104 and the floating diffusion well 204. The transfer gate 202 may be a vertical gate extending into the p-type EPI layer 128 and between the upper doped photodiode region 105 and the floating diffusion well 204. The floating diffusion well 204 may be a heavily doped n-type region doped by an implanting process.

Figure 2A:
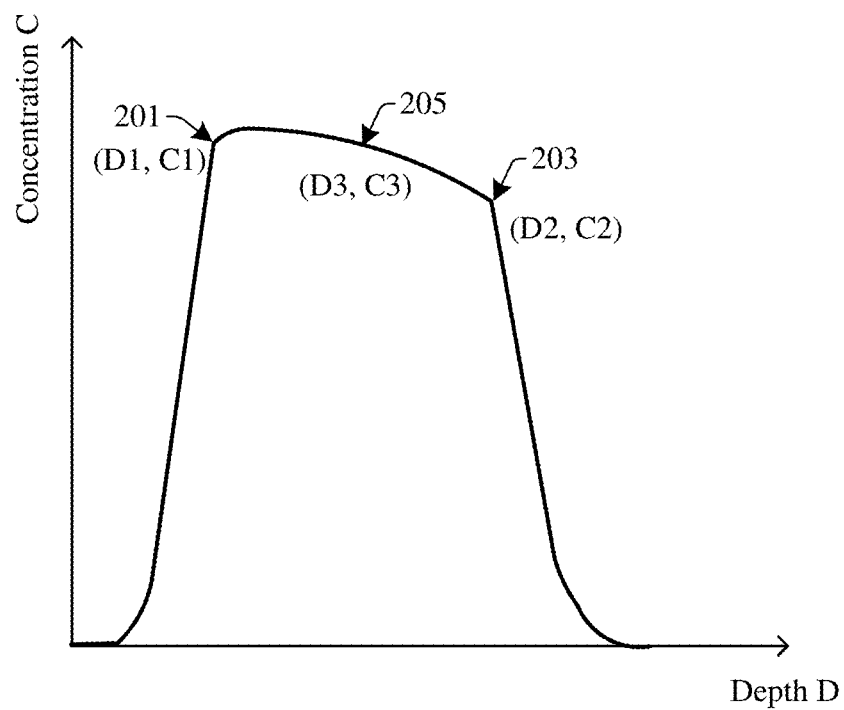
FIGS. 2A-2C illustrate diagrams of some embodiments of a doping concentration distribution for a doped layer of an epitaxial deposited photodiode structure.
Figure 2B:
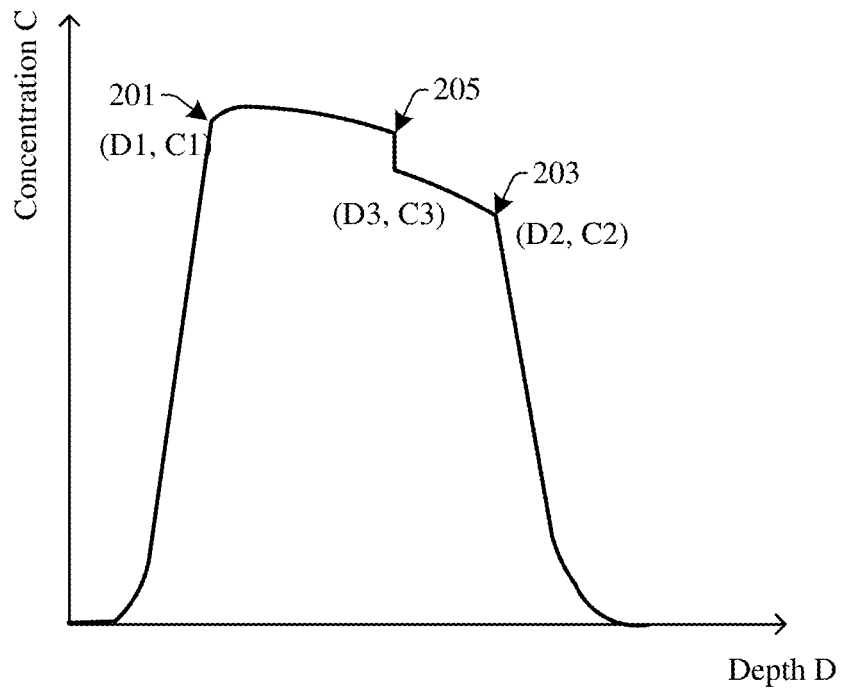
Figure 2C:
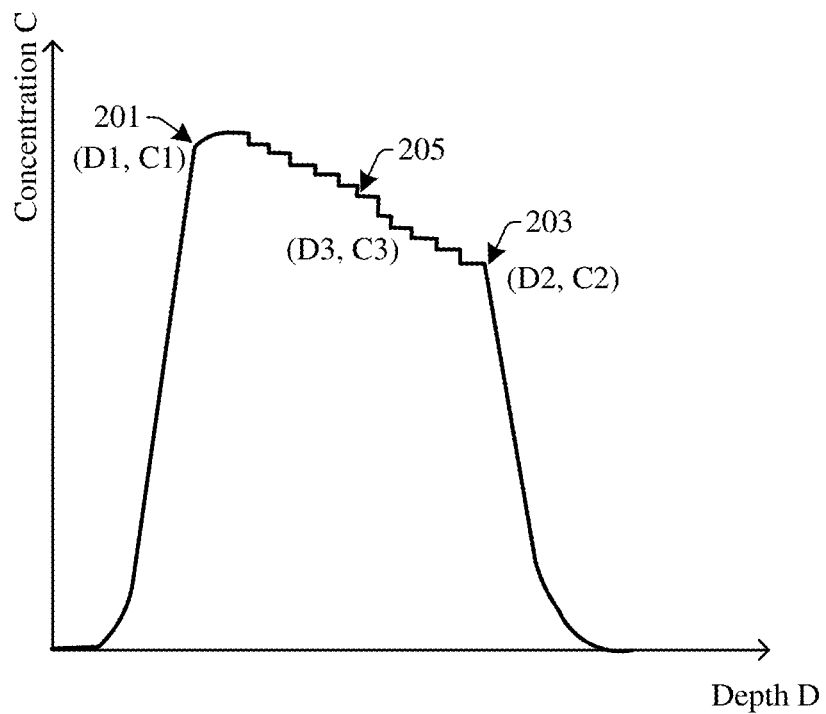

FIGS. 2A-2C illustrate diagrams of a doping concentration distribution for a doped layer of an epitaxial deposited photodiode structure according to some embodiments. As described above associated with FIG. 1, the n-type doped epitaxial layer 132 and the n-type EPI layer 130 are epitaxial deposited semiconductor layers that have a doping concentration monotonically decreasing from the front-side 122 to the back-side 124. FIGS. 2A-2C shows some example diagrams of a doping concentration of the n-type doped epitaxial layer 132 and/or the n-type EPI layer 130 versus a depth from the front-side 122. A first data point 201 represents a first doping concentration C1 at the top surface or an upper surface of the n-type EPI layer 130 with a first depth D1 from the front-side 122 of the image sensing die 134. A second data point 203 represents a second doping concentration C2 at the bottom surface or a lower surface of the n-type doped epitaxial layer 132 with a second depth D2 from the front-side 122 of the image sensing die 134. A third data point 205 represents a third doping concentration C3 at the interface of the n-type EPI layer 130 and the n-type doped epitaxial layer 132 with a third depth D3 from the front-side 122 of the image sensing die 134. FIG. 2A shows a situation where the n-type EPI layer 130 and the n-type doped epitaxial layer 132 have a continuously gradient smooth doping concentration. The first doping concentration C1 monotonically and continuously decreases to the second doping concentration C2 from the first depth D1 to the second depth D2. Alternatively, FIG. 2B show a situation where the n-type EPI layer 130 and the n-type doped epitaxial layer 132 may have a monotonically decreasing doping concentration with a decreasing step at the interface of the n-type EPI layer 130 and the n-type doped epitaxial layer 132. FIG. 2C show a closer demonstration of the doping concentration of the n-type EPI layer 130 and the n-type doped epitaxial layer 132 according to some embodiments. The n-type EPI layer 130 and the n-type doped epitaxial layer 132 may be formed by one or more deposition processes with doping concentrations changed in gradient as of a fixed or changed time interval. Thus, the doping concentration diagram may show some steps if the choose time interval is relative large. As an example, the first doping concentration C1 may be about $1\times10^{19}$ cm$^{-3}$, and the second doping concentration C2 may be about $1\times10^{15}$ cm$^{-3}$ with phosphorous or arsenic as an n-type dopant. A depth difference of D1 and D2 may be about 4 μm to about 6 μm.

Figure 3:
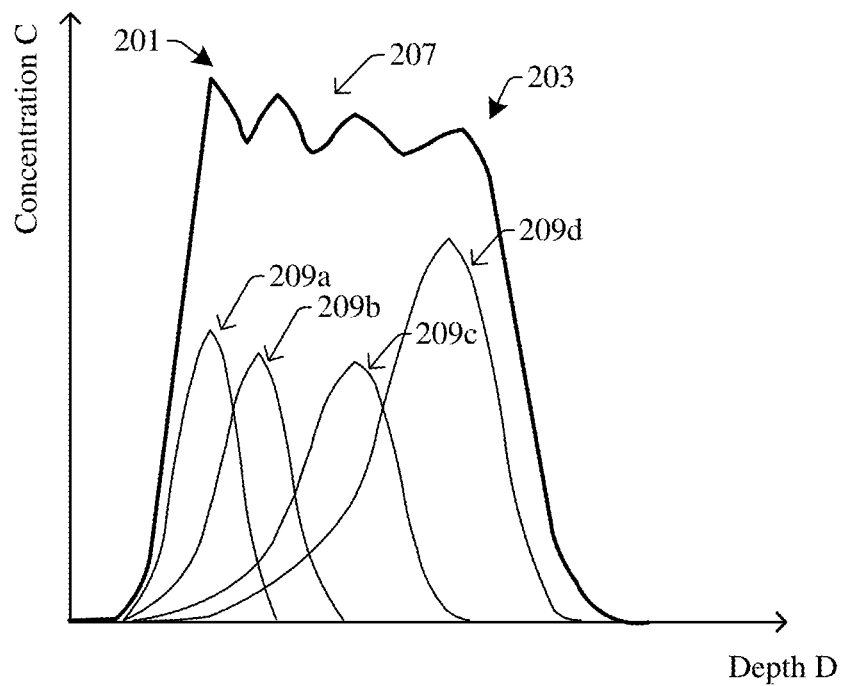
FIG. 3 illustrates a diagram of an alternative approach of a doping concentration distribution for a doped layer of a photodiode structure.

FIG. 3 illustrates a diagram of an alternative approach of a doping concentration distribution for a doped layer of a photodiode structure, where the doped layer may be formed by an implantation process. If the n-type EPI layer 130 and the n-type doped epitaxial layer 132 in FIG. 1 were formed by implantation processes represented by doping concentration profiles 209a, 209b, 209c, 209d as an example in the p-type EPI layer 128, rather than epitaxial deposition processes, the resulted doping concentration profile 207 from the first data point 201 to the second data point 203 would have a wavy trend decreasing and increasing non-monotonically from the front-side 122 to the back-side 124 of the image sensing die 134. By forming the n-type EPI layer 130 and the n-type doped epitaxial layer 132 in FIG. 1 by epitaxial deposition processes, a more uniform and smoother doping profile can be achieved with better controllability.

Figure 4A:
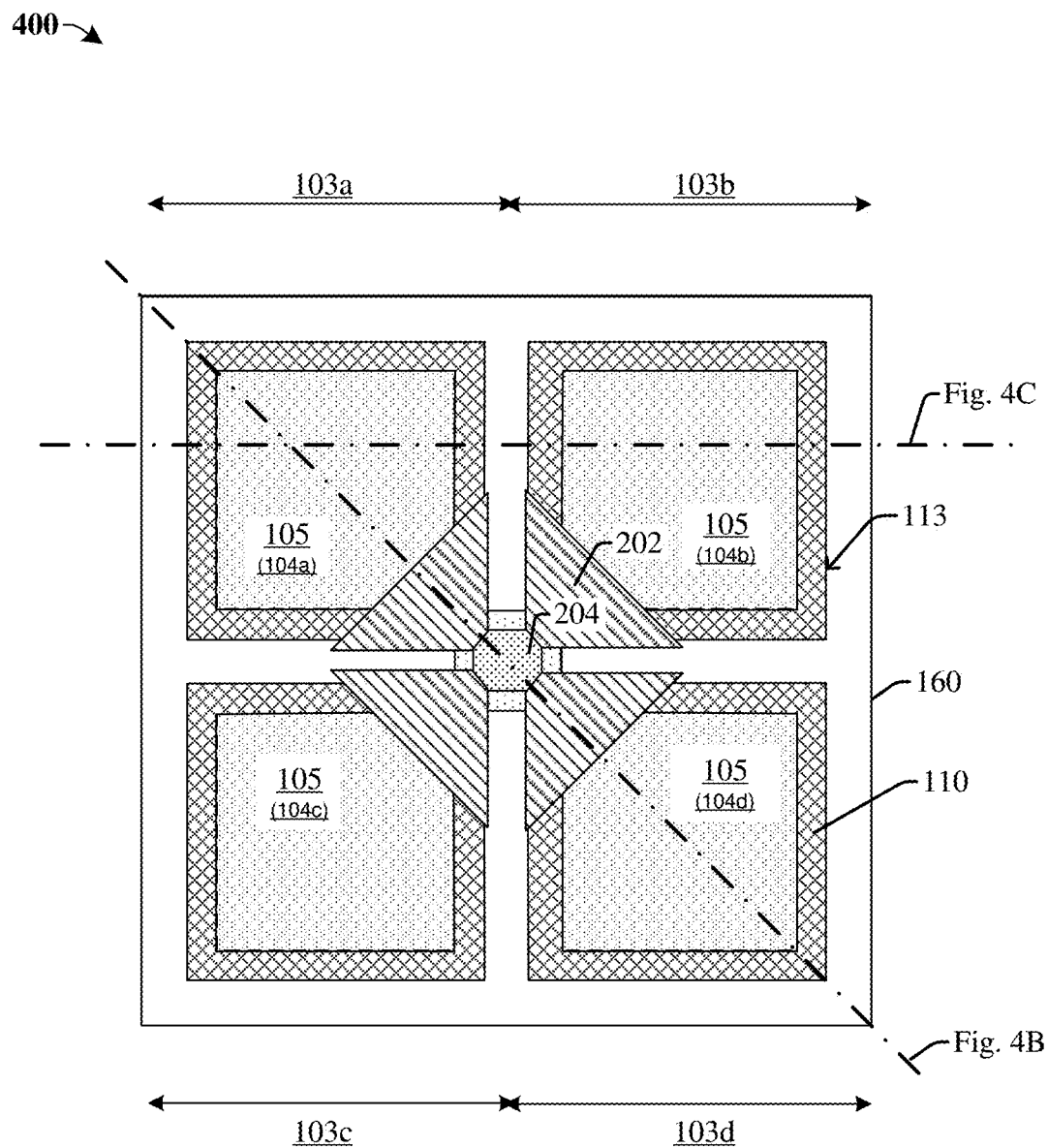
FIGS. 4A-4C illustrate a top view and some cross-sectional views of some embodiments of an image sensor comprising a plurality of pixel regions of an image sensing die comprising a plurality of epitaxial deposited photodiode structures separated by an isolation structure.
Figure 4B:
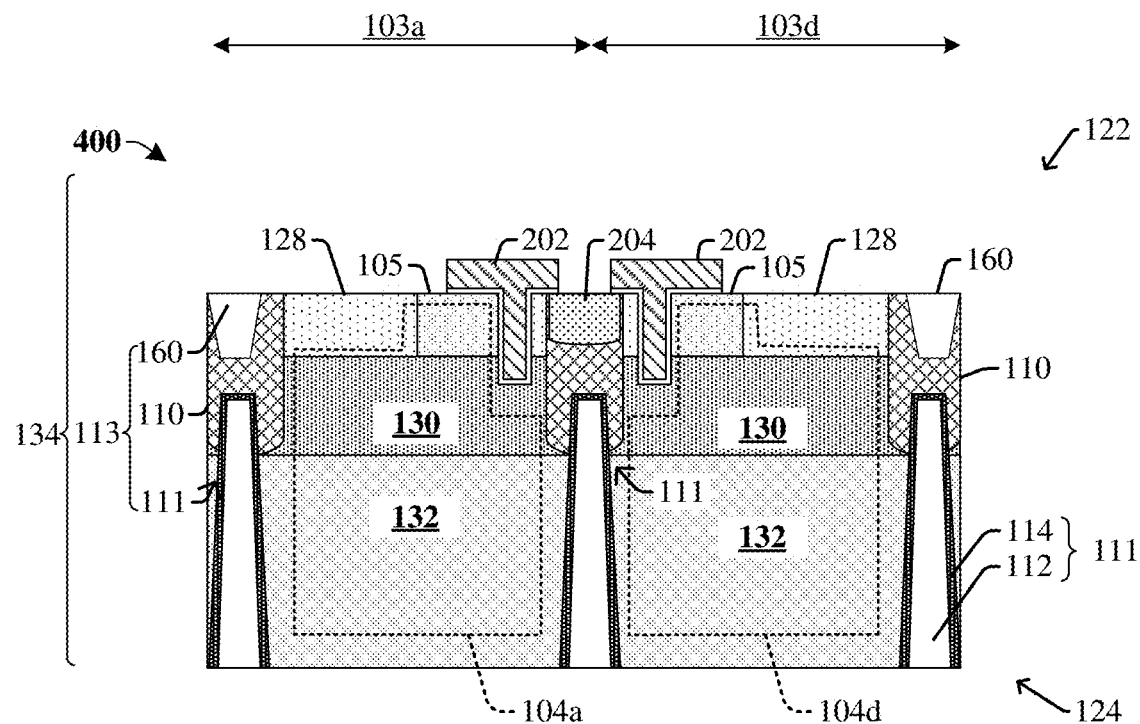
Figure 4C:
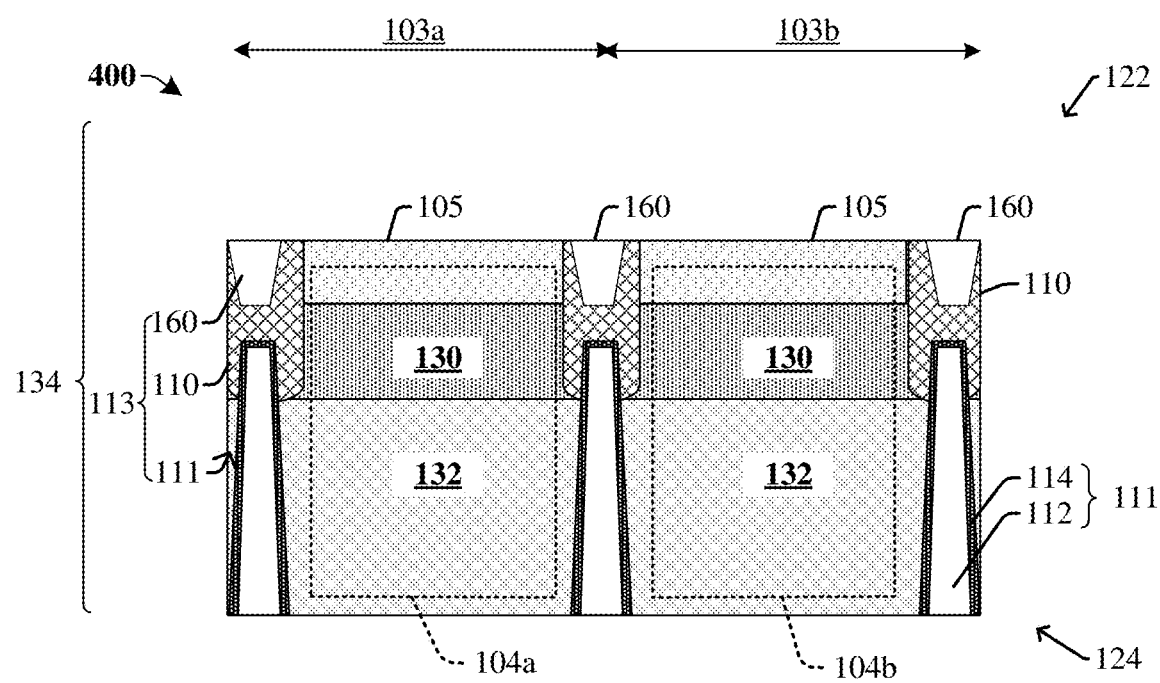

FIGS. 4A-4C illustrate a top view and some cross-sectional views of an image sensor 400 comprising a plurality of pixel regions (e.g., 103a, 103b, 103c, and 103d) having a plurality of epitaxial deposited photodiode structures (e.g., 104a, 104b, 104c, and 104d) respectively disposed in an image sensing die 134 (see FIGS. 4B-4C) and separated by an isolation structure 113 according to some embodiments. Features of the image sensing die 134 shown in FIG. 1 and other figures can be incorporated in the image sensor 400 when applicable. The plurality of pixel regions may be arranged in an array comprising rows and/or columns and may include various amount of pixel regions according to different applications. In FIG. 4A, four pixel regions 103a, 103b, 103c, and 103d are shown as sharing a common floating diffusion well 204, but it is understood that other pixel region layouts can also be adopted.

As shown in FIGS. 4B and 4C, the n-type doped epitaxial layer 132, the n-type EPI layer 130 and the p-type EPI layer 128 are epitaxial deposited semiconductor layers that are disposed across pixel regions 103a, 103d in FIG. 4B or 103a, 103b in FIG. 4C. An isolation structure 113 is disposed between and isolates adjacent pixel regions 103a, 103d in FIG. 4B or 103a, 103b in FIG. 4C. If the n-type EPI layer 130 and the n-type doped epitaxial layer 132 were formed in the p-type EPI layer 128 by implantation processes, rather than epitaxial deposition processes, the n-type EPI layer 130 or the n-type doped epitaxial layer 132 would be disposed within the respective pixel regions 103a, 103d in FIG. 4B or 103a, 103b in FIG. 4C and not disposed across disposed across the pixel regions 103a, 103d in FIG. 4B or 103a, 103b in FIG. 4C. The n-type EPI layer 130 and the n-type doped epitaxial layer 132 would not have the entire sidewalls directly contact the isolation structure 113 and would be narrower. A full well capacity of the respective photodiode structure would not be as large as the n-type EPI layer 130 and the n-type doped epitaxial layer 132 formed by epitaxial deposition, which have the entire sidewalls directly contact the isolation structure 113 and are widest to reach boundaries of the isolation structure 113.

In some embodiments, the isolation structure 113 comprises the DTI structure 111 disposed from the back-side 124 of the image sensing die 134 into the n-type EPI layer 130 between and isolate adjacent pixel regions 103a, 103d in FIG. 4B or 103a, 103b in FIG. 4C. The the DTI structure 111 comprises the doped liner 114 lining sidewall and bottom surfaces of the dielectric fill layer 112. In some embodiments, the DTI structure 111 further comprises a high-k dielectric liner (not shown in the figure) disposed between the doped liner 114 and the dielectric fill layer 112 and separating the doped liner 114 from dielectric fill layer 112. The high-k dielectric liner may also be a conformal layer. The high-k dielectric liner may be or be comprised of aluminum oxide ($Al_2O_3$), hafnium oxide ($HfO_2$), hafnium silicon oxide (HfSiO), hafnium aluminum oxide (HfAlO), tantalum oxide ($Ta_2O_5$), or hafnium tantalum oxide (HMO), for example. Other applicable high-k dielectric materials are also within the scope of the disclosure. The doped liner 114, the high-k dielectric liner, and the dielectric fill layer 112 may laterally extend along the back-side 124 of the image sensing die 134 according to some alternative embodiments not shown in the figure.

In some embodiments, a doped shallow isolation well 110 is disposed between and isolate adjacent pixel regions 103a, 103d in FIG. 4B or 103a, 103b in FIG. 4C, extending from the front-side 122 of the image sensing die 134 to a position within the p-type EPI layer 128. The doped shallow isolation well 110 may have the second doping type (e.g., p-type doping). In some embodiments, a bottom portion of the DTI structure 111 may be disposed within a recessed top surface of the doped shallow isolation well 110. In this case, the doped shallow isolation well 110 may reach less than a half or even less than ¼ depth of the DTI structure 111. The doped shallow isolation well 110 may be vertically aligned with the DTI structure 111 (e.g. sharing a common center line). The DTI structure 111 and the doped shallow isolation well 110 collectively function as isolations for the pixel regions 103a, 103d in FIG. 4B or 103a, 103b in FIG. 4C, such that crosstalk and blooming among the pixel regions 103a, 103d in FIG. 4B or 103a, 103b in FIG. 4C can be reduced. The DTI structure 111 and the doped shallow isolation well 110 also collectively facilitate depletion of the photodiode structure 104 during the operation since the DTI structure 111 and the doped shallow isolation well 110 provide additional p-type dopants to the photodiode structure 104.

In addition, in some embodiments, a shallow trench isolation (STI) structure 160 may be disposed between the adjacent pixel regions 103a, 103d in FIG. 4B or 103a, 103b in FIG. 4C from the front-side 122 of the image sensing die 134 to a position within the p-type EPI layer 128. The STI structure 160 and the DTI structure 111 may be vertically aligned (e.g. sharing a common center line, which may or may not share a center line with the doped shallow isolation well 110). In some embodiments, the doped shallow isolation well 110 extends from the front-side 122 of the image sensing die 134 to a position within the p-type EPI layer 128 and surrounds the STI structure 160. The doped shallow isolation well 110 may separate the STI structure 160 from the DTI structure 111. The DTI structure 111, the doped shallow isolation well 110, and the STI structure 160 collectively function as isolations for the pixel regions 103a, 103d in FIG. 4B or 103a, 103b in FIG. 4C, such that crosstalk and blooming among the pixel regions 103a, 103d in FIG. 4B or 103a, 103b in FIG. 4C can be reduced. The doped liner 114 of the DTI structure 111 and the doped shallow isolation well 110 also collectively facilitate depletion of the photodiode structures 104a-d during the operation, such that full well capacity is improved.

In some embodiments, as shown in FIG. 4B, the floating diffusion well 204 is disposed between two pixel regions (e.g., 103a, 103d) from the front-side 122 of the image sensing die 134 to a position within the p-type EPI layer 128. In some embodiments, the DTI structure 111 extends to a location in the n-type EPI layer 130 overlying the floating diffusion well 204. The DTI structure 111 and the floating diffusion well 204 may be vertically aligned (e.g. sharing a common center line). A transfer gate 202 is arranged laterally between the photodiode structure 104 and the floating diffusion well 204. During the operation, the transfer gate 202 controls charge transfer from the photodiode structure 104 to the floating diffusion well 204. If the charge level is sufficiently high within the floating diffusion well 204, a source follower transistor (not shown) is activated and charges are selectively output according to operation of a row select transistor (not shown) used for addressing. A reset transistor (not shown) can be used to reset the photodiode structure 104 between exposure periods.

Figure 5:
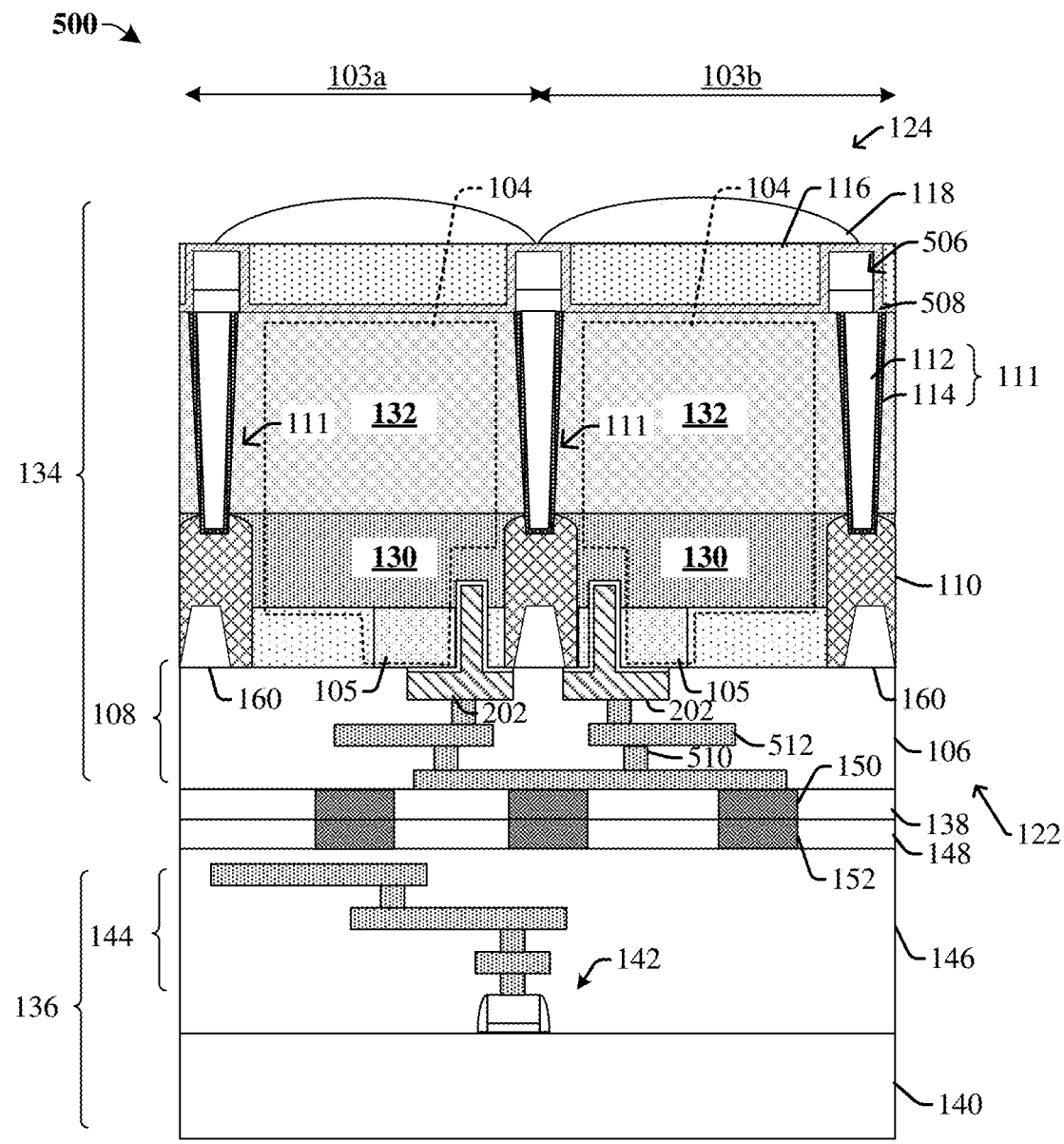
FIG. 5 illustrates a cross-sectional view of some embodiments of an integrated chip comprising an image sensing die and a logic die bonded together where the image sensing die has an epitaxial deposited photodiode structure.

FIG. 5 illustrates a cross-sectional view of an integrated chip 500 comprising an image sensing die 134 and a logic die 136 bonded together according to some embodiments. Structures of image sensing dies disclosed associated with other figures herebefore and hereafter can be incorporated to the image sensing die 134 when applicable. A metallization stack 108 may be arranged on the front-side 122 of the image sensing die 134. The metallization stack 108 comprises a plurality of metal interconnect layers arranged within one or more inter-level dielectric (ILD) layer 106. The ILD layer 106 may comprise one or more of a low-k dielectric layer (i.e., a dielectric with a dielectric constant less than about 3.9), an ultra low-k dielectric layer, or an oxide (e.g., silicon oxide). A plurality of metal interconnecting vias 510 and metal lines 512 may be disposed within the ILD layer 106 and provide electrical connections for the transfer gates 202 and the photodiode structures 104.

The logic die 136 may comprise logic devices 142 disposed over a logic substrate 140. The logic die 136 may further comprises a metallization stack 144 disposed within an ILD layer 146 overlying the logic devices 142. The image sensing die 134 and the logic die 136 may be bonded face to face, face to back, or back to back. As an example, FIG. 4 shows a face to face bonding structure where a pair of intermediate bonding dielectric layers 138, 148, and bonding pads 150, 152 are arranged between the image sensing die 134 and the logic die 136 and respectively bond the metallization stacks 108, 144 through a fusion or a eutectic bonding structure.

In some embodiments, a DTI structure 111 is disposed from the back-side 124 of the image sensing die 134 into the n-type EPI layer 130, is disposed between and isolates adjacent pixel regions 103a, 103b. The isolation structure 113 comprises the doped liner 114 lining sidewall and bottom surfaces of the dielectric fill layer 112. In some embodiments, the DTI structure 111 further comprises a high-k dielectric liner (not shown in the figure) disposed between the doped liner 114 and the dielectric fill layer 112 and separating the doped liner 114 from dielectric fill layer 112. The high-k dielectric liner may also be a conformal layer. The high-k dielectric liner may be or be comprised of aluminum oxide ($Al_2O_3$), hafnium oxide ($HfO_2$), hafnium silicon oxide (HfSiO), hafnium aluminum oxide (HfAlO), tantalum oxide ($Ta_2O_5$), or hafnium tantalum oxide (HMO), for example. Other applicable high-k dielectric materials are also within the scope of the disclosure. The doped liner 114, the high-k dielectric liner, and the dielectric fill layer 112 may laterally extend along the back-side 124 of the image sensing die 134 according to some alternative embodiments not shown in the figure.

In some embodiments, a plurality of color filters 116 are arranged over the back-side 124 of the image sensing die 134. The plurality of color filters 116 are respectively configured to transmit specific wavelengths of incident radiation or incident light. For example, a first color filter (e.g., a red color filter) may transmit light having wavelengths within a first range, while a second color filter may transmit light having wavelengths within a second range different than the first range. In some embodiments, the plurality of color filters 116 may be arranged within a composite grid structure 506 overlying the plurality of epitaxial deposited photodiode structures 104. The composite grid structure 506 is disposed between and overlying pixel regions 103a, 103b. The composite grid structure 506 may comprise metal and dielectric layers stacked at the back-side 124 of the image sensing die 134. A dielectric liner 508 may line sidewall and top of the composite grid structure 506.

In some embodiments, a plurality of micro-lenses 118 is arranged over the plurality of color filters 116. Respective micro-lenses 118 are aligned laterally with the color filters 116 and overlie the pixel regions 103a, 103b. In some embodiments, the plurality of micro-lenses 118 have a substantially flat bottom surface abutting the plurality of color filters 116 and a curved upper surface. The curved upper surface is configured to focus the incident radiation or incident light (e.g., light towards the underlying pixel regions 103a, 103b. During operation of the image sensor, the incident radiation or incident light is focused by the micro-lenses 118 to the underlying pixel regions 103a, 103b. When incident radiation or incident light of sufficient energy strikes the photodiode structures 104, it generates an electron-hole pair that produces a photocurrent. Described above is one type of backside illuminated (BSI) image sensor device. BSI image sensor devices are used for sensing a volume of light projected towards the back-side 124 of the image sensing die. A front-side illuminated (FSI) image sensor device is also amenable with this disclosure. BSI image sensor devices provide a reduced destructive interference as compared to the FSI image sensor devices. Notably, though the micro-lenses 118 is shown as fixing onto the image sensor in FIG. 1, it is appreciated that the image sensor may not include micro-lens, and the micro-lens may be attached to the image sensor later in a separate manufacture activity.

FIGS. 6-15 illustrate some embodiments of cross-sectional and top views showing a method of forming an image sensor having an epitaxial deposited photodiode. In some embodiments, the formation of the epitaxial deposited photodiode includes a series of blanket epitaxial process across the plurality of pixel regions to form a first doped EPI layer of a first doping type and a second doped EPI layer of a second doping type on the handing substrate. Compared to an alternative approach to form a second doped EPI layer deep in a first doped EPI layer by a high energy implantation, processes of photolithography, implantation, and thermal activation can be omitted. And a more uniform and smoother doping profile can be achieved for the formed doped layer with better controllability. Also, full well capacity of the photodiode structures is enlarged by increased photodiode area. Furthermore, as explained in more details later, selection of handling substrate and its removal process is more flexible due to the blanket coverage of the epitaxial process.

Figure 6:
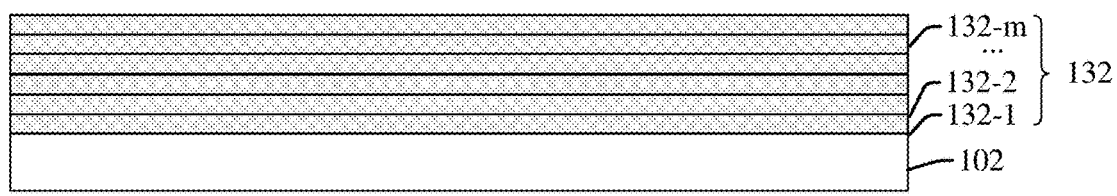
FIGS. 6-16 illustrate some embodiments of cross-sectional views showing a method of forming an image sensor having an epitaxial deposited photodiode structure.
Figure 6:
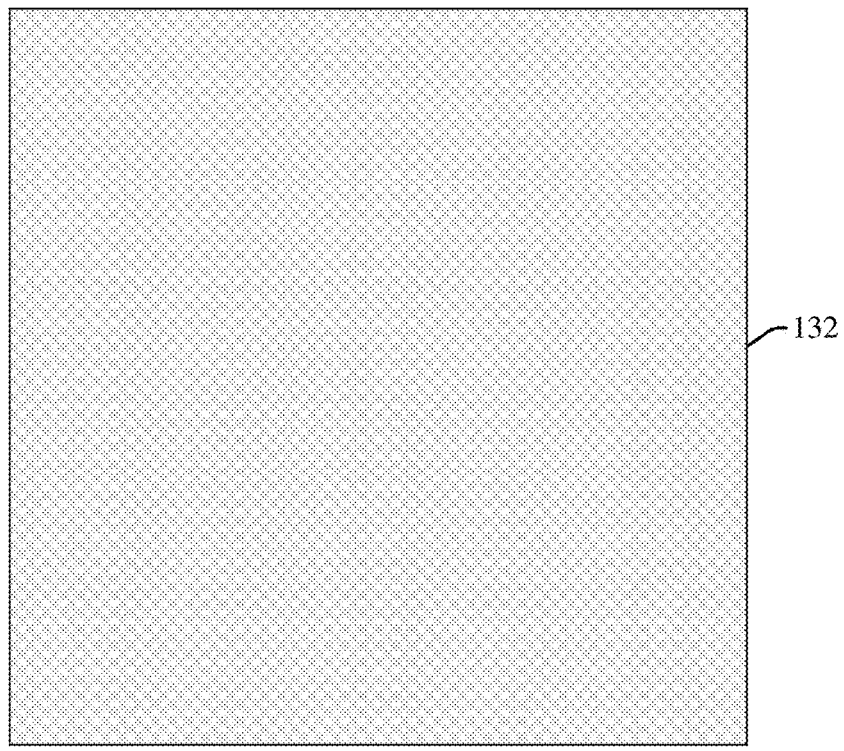

As shown in cross-sectional view 600a and top view 600b of FIG. 6, in some embodiments, a handling substrate 102 is provided, and an n-type doped epitaxial layer 132 is formed over the handling substrate 102. In various embodiments, the handling substrate 102 may comprise any type of semiconductor body (e.g., silicon/germanium/CMOS bulk, SiGe, SOI, etc.) such as a semiconductor wafer or one or more die on a wafer, as well as any other type of semiconductor and/or epitaxial layers formed thereon and/or otherwise associated therewith. For example, the handling substrate 102 can be or be comprised of a p-type doped substrate layer of a semiconductor wafer or a p-type doped well formed in a semiconductor wafer by deposition or implantation process. In some embodiments, the n-type doped epitaxial layer 132 is formed by a blanket epitaxial deposition process including depositing a series of epitaxial semiconductor layers 132-1, 132-2, . . . , 132-m with a doping concentration monotonically increasing. In some embodiments, the formation of the n-type doped epitaxial layer 132 is to replace a formation of an array deep n-type well (ADNW) formed by an implantation process of an alternative approach.

Figure 7:
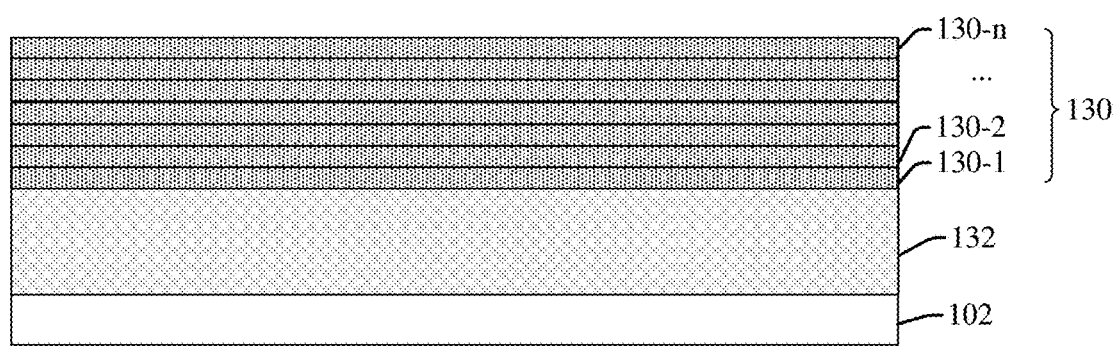
Figure 7:
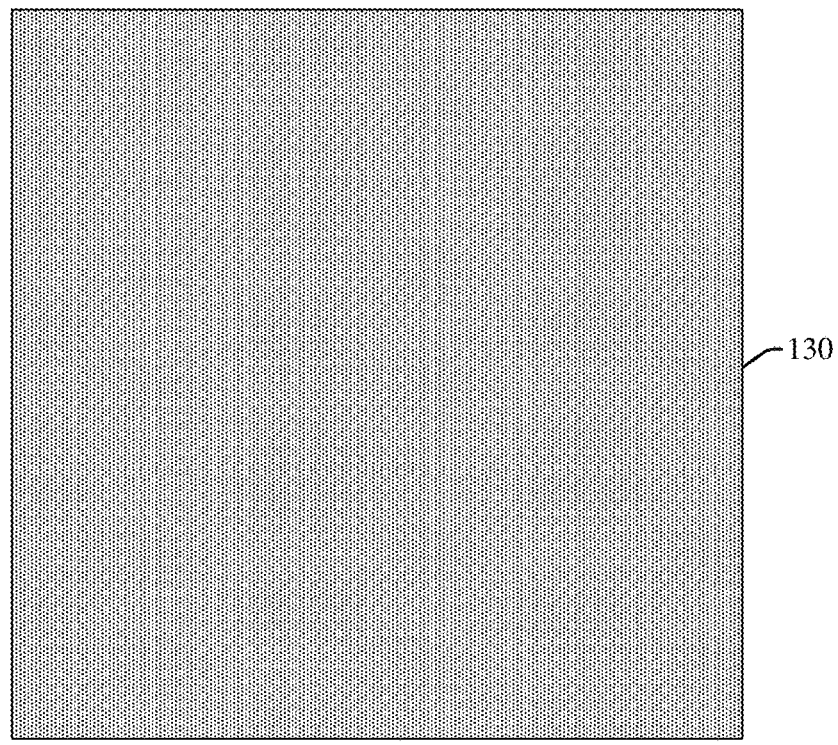

As shown in cross-sectional view 700a and top view 700b of FIG. 7, in some embodiments, an n-type EPI layer 130 is formed on the n-type doped epitaxial layer 132 over the handling substrate 102. In some embodiments, the n-type EPI layer 130 is formed by a blanket epitaxial deposition process including depositing a series of epitaxial semiconductor layers 130-1, 130-2, . . . , 130-n with a doping concentration monotonically increasing. As discussed above associated with FIGS. 1 and 2A-2C, the n-type EPI layer 130 may have a doping concentration greater than that of the n-type doped epitaxial layer 132. As an example, a collective thickness of the n-type EPI layer 130 and the n-type doped epitaxial layer 132 may be in a range between approximately 4 μm and approximately 6 μm, and a concentration of phosphorous can be in a range of from about $1 \times 10^{15}$ cm$^{-3}$ to about $1 \times 10^{19}$ cm$^{-3}$.

In some embodiments, the formation of the epitaxial deposited n-type EPI layer 130 is to replace a formation of a deep n-type photodiode region (DNPD) formed by an implantation process of an alternative approach. The deep n-type photodiode region may be formed as discrete implanted doped regions within respective pixel regions, while the n-type EPI layer 130 may be formed across boundaries of the array of pixel regions.

Figure 8:
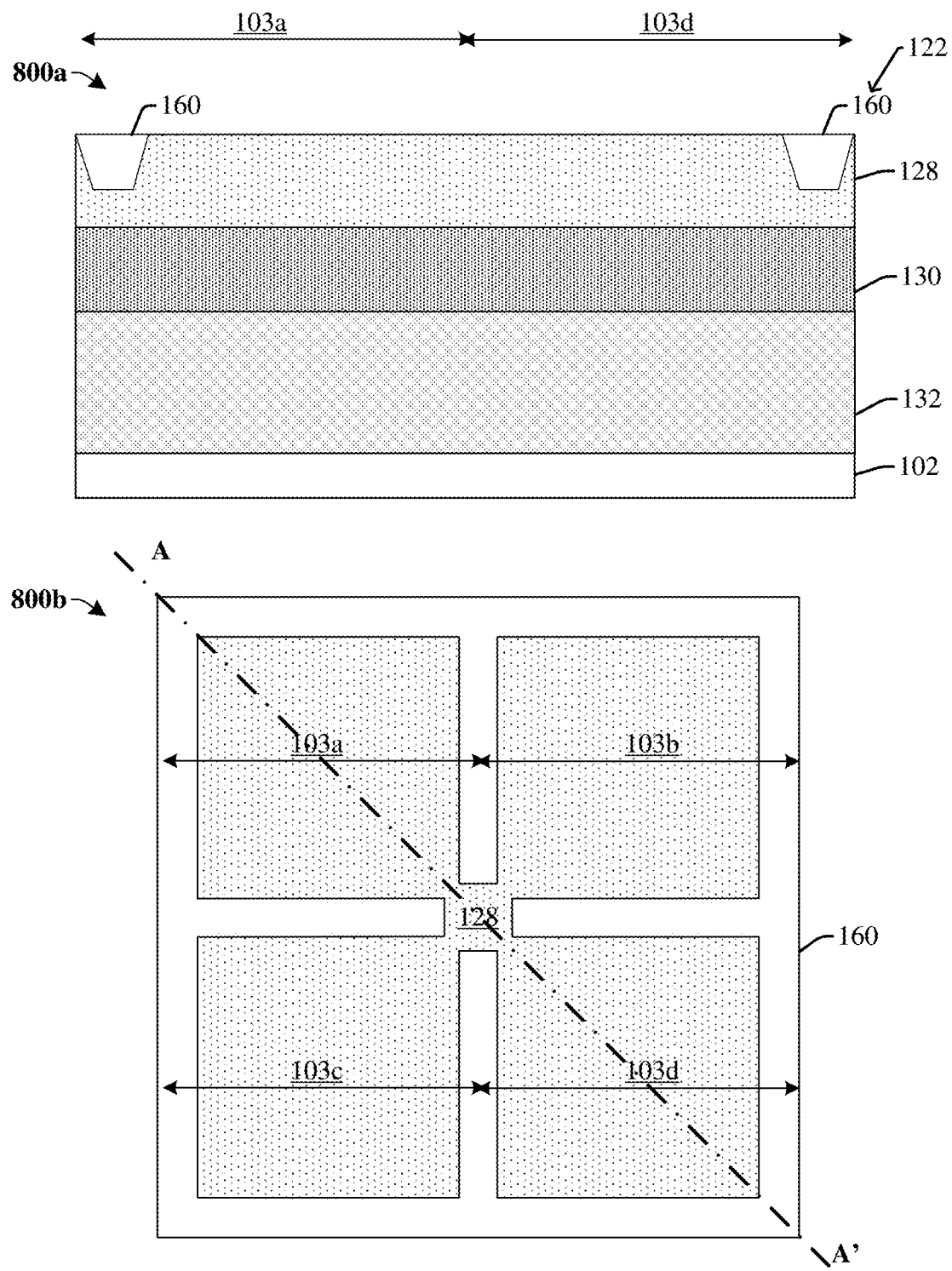

As shown in a cross-sectional view 800a along line A-A' of a top view 800b of FIG. 8, in some embodiments, a p-type EPI layer 128 is formed on the n-type EPI layer 130. The p-type EPI layer 128 may be formed by a p-type epitaxial process. As an example, a thickness of the p-type EPI layer 128 may be around 2 μm, and a concentration of boron can be in a range of from about $1 \times 10^{13}$ cm$^{-3}$ to about $1 \times 10^{15}$ cm$^{-3}$. In some embodiments, a plurality of STI structures 160 is formed between adjacent pixel regions 103a, 103d from a front-side 122 of the image sensor to a position within the p-type EPI layer 128. The one or more STI structures 160 may be formed by selectively etching the p-type EPI layer 128 from the front-side 122 to form shallow-trenches and subsequently forming an oxide or other dielectric material within the shallow-trenches.

Figure 9:
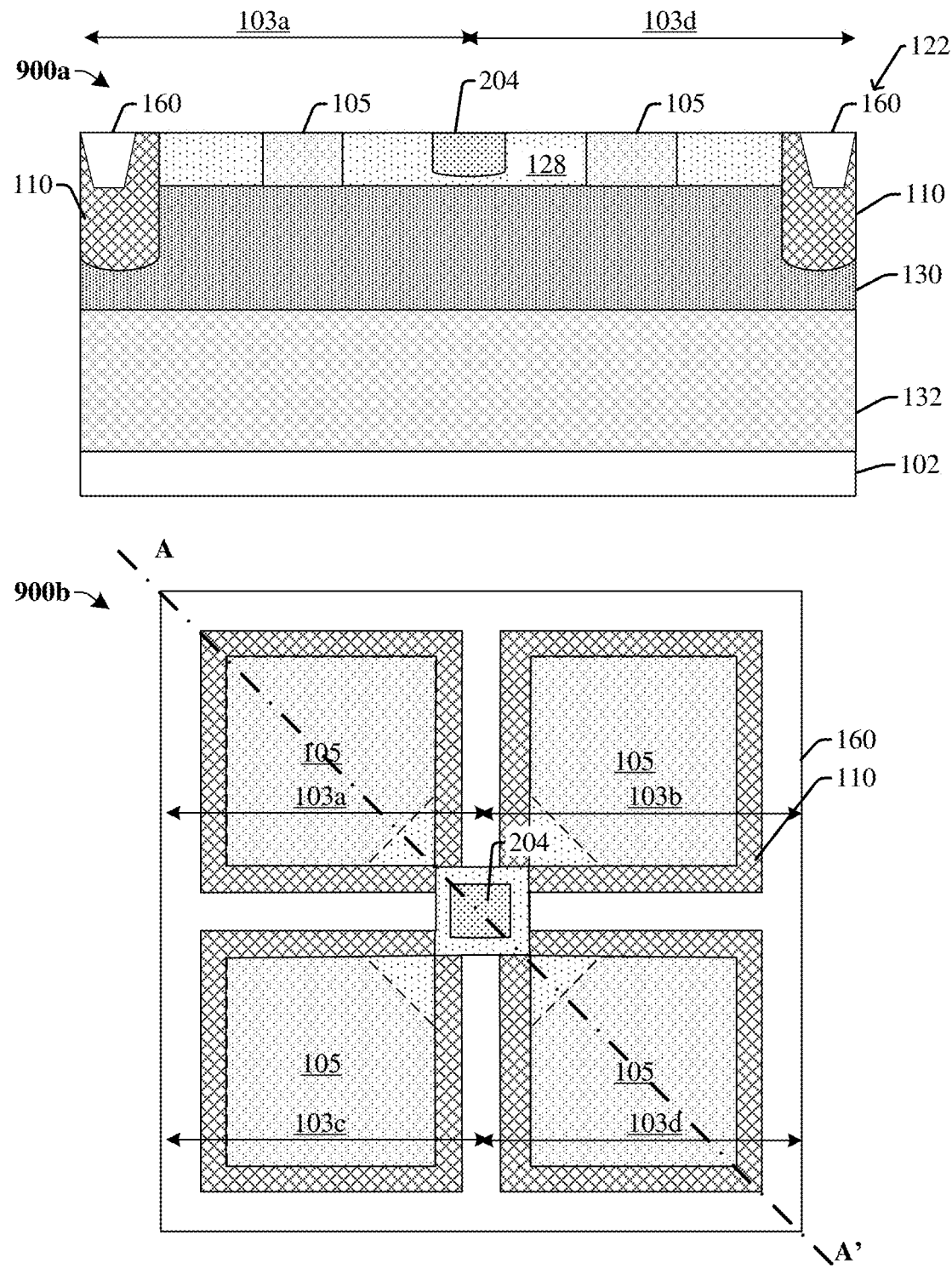

As shown in a cross-sectional view 900a along line A-A' of a top view 900b of FIG. 9, in some embodiments, a series of doping processes is performed to form a plurality of upper doped photodiode regions 105, a plurality of doped shallow isolation wells 110 and/or a plurality of floating diffusion wells 204. In some embodiments, the doping processes comprise implantations from the front-side 122 into the p-type EPI layer 128 and/or the n-type EPI layer 130 selectively according to patterned masking layers (not shown) comprising photoresist. A plurality of upper doped photodiode regions 105 may be formed by implanting n-type dopant species within upper portions of the p-type EPI layer 128 within the pixel regions 103a, 103d. In some embodiments, the upper doped photodiode regions 105 has a doping concentration that firstly increases then decreases or at least increasing or decreasing non-monotonically from the back-side 124 to the front-side 122. The formed upper doped photodiode regions 105 may have a bottom surface contacting an upper surface of the n-type EPI layer 130. The epitaxial deposited n-type EPI layer 130 and the implanted upper doped photodiode regions 105 collectively work as the first region of the photodiode structure 104 with the first doping type. In some cases, a highly doped shallow p-type region (not shown in the figure) may be formed in an upper region of the upper doped photodiode regions 105 to form a pinned photodiode structure that enhance depletion and reduce lag and dark current. The plurality of doped shallow isolation wells 110 may be formed by implanting p-type dopant species into the p-type EPI layer 128 between adjacent pixel regions 103a, 103d. The plurality of doped shallow isolation wells 110 may be formed from the front-side 122 of the image sensing die 134 to a position deeper than the STI structures 160. The doped shallow isolation wells 110 may respectively be centrally aligned with the STI structures 160.

Figure 10:
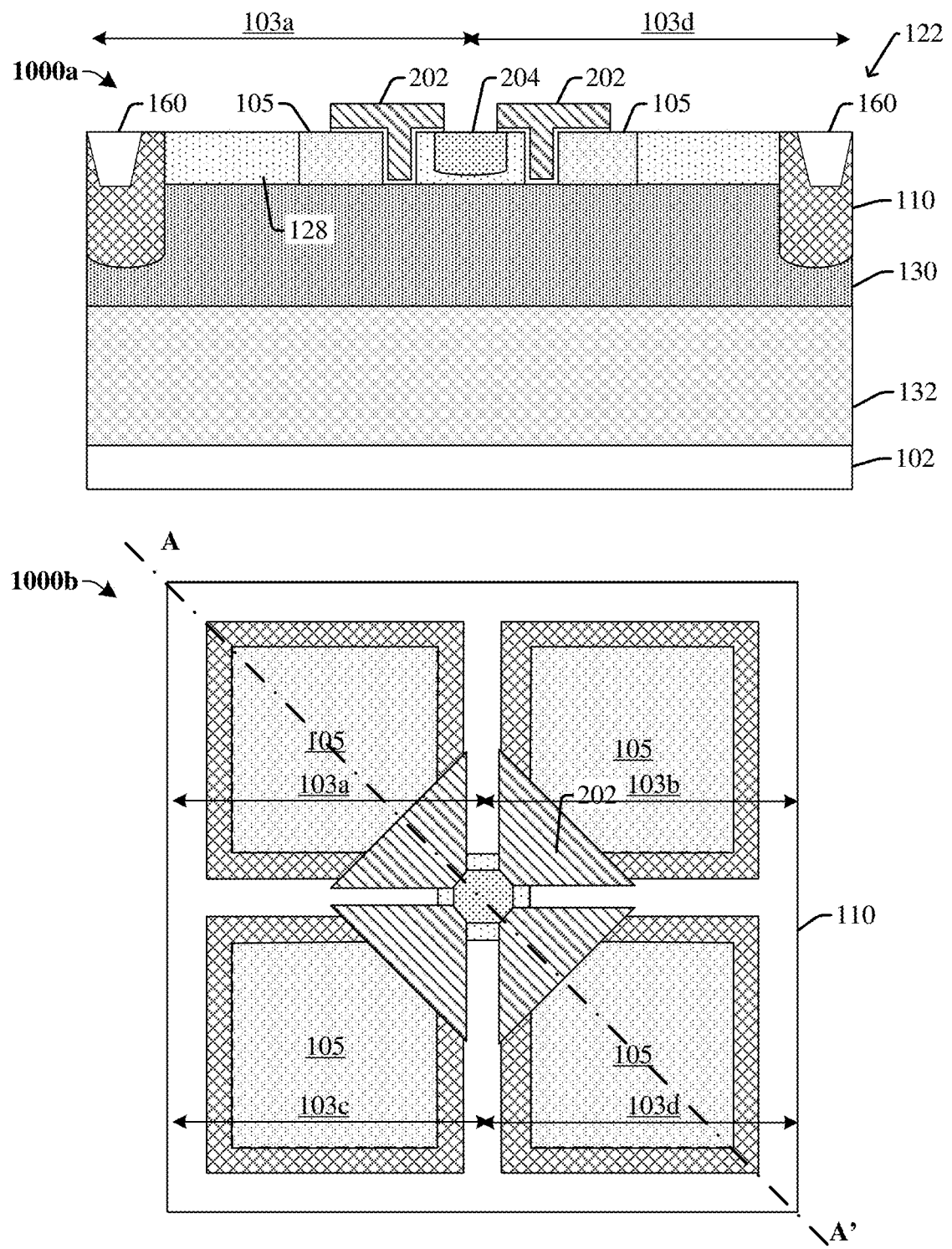

As shown in a cross-sectional view 1000a along line A-A' of a top view 1000b of FIG. 10, in some embodiments, a plurality of transfer gates 202 is formed over the front-side 122 of the image sensor between the floating diffusion wells 204 and the upper doped photodiode regions 105. The transfer gates 202 may be formed by depositing a gate dielectric layer and a gate electrode layer followed by a patterning process to form a gate dielectric and a gate electrode.

Figure 11:
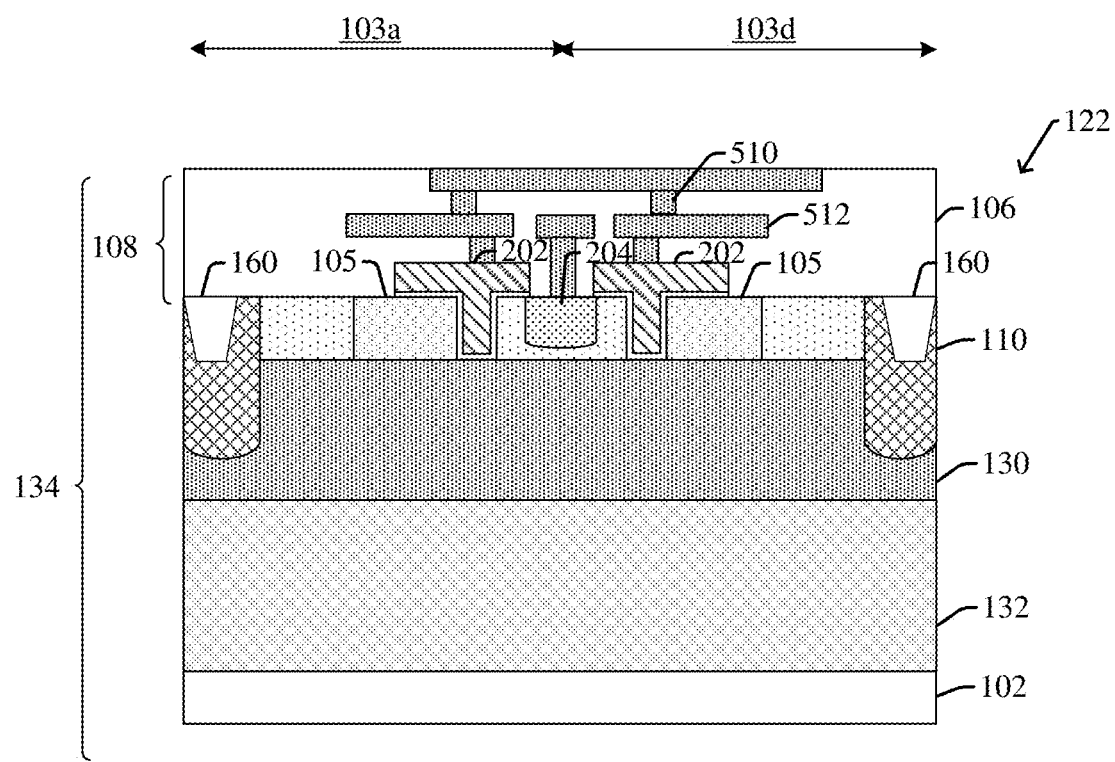

As shown in cross-sectional view 1100 of FIG. 11, in some embodiments, a metallization stack 108 may be formed overlying the transfer gates 202. In some embodiments, the metallization stack 108 may be formed by forming an ILD layer 106, which comprises one or more layers of ILD material, followed by etching processes to form via holes and/or metal trenches. The via holes and/or metal trenches are then filled with a conductive material to form the plurality of metal interconnect vias 510 and metal lines 512. In some embodiments, the ILD layer 106 may be deposited by a physical vapor deposition technique. The plurality of metal interconnect layers may be formed using a deposition process and/or a plating process (e.g., electroplating, electro-less plating, etc.). In various embodiments, the plurality of metal interconnect layers may comprise tungsten, copper, or aluminum copper, for example. Thus, the image sensing die 134 is formed.

Figure 12:
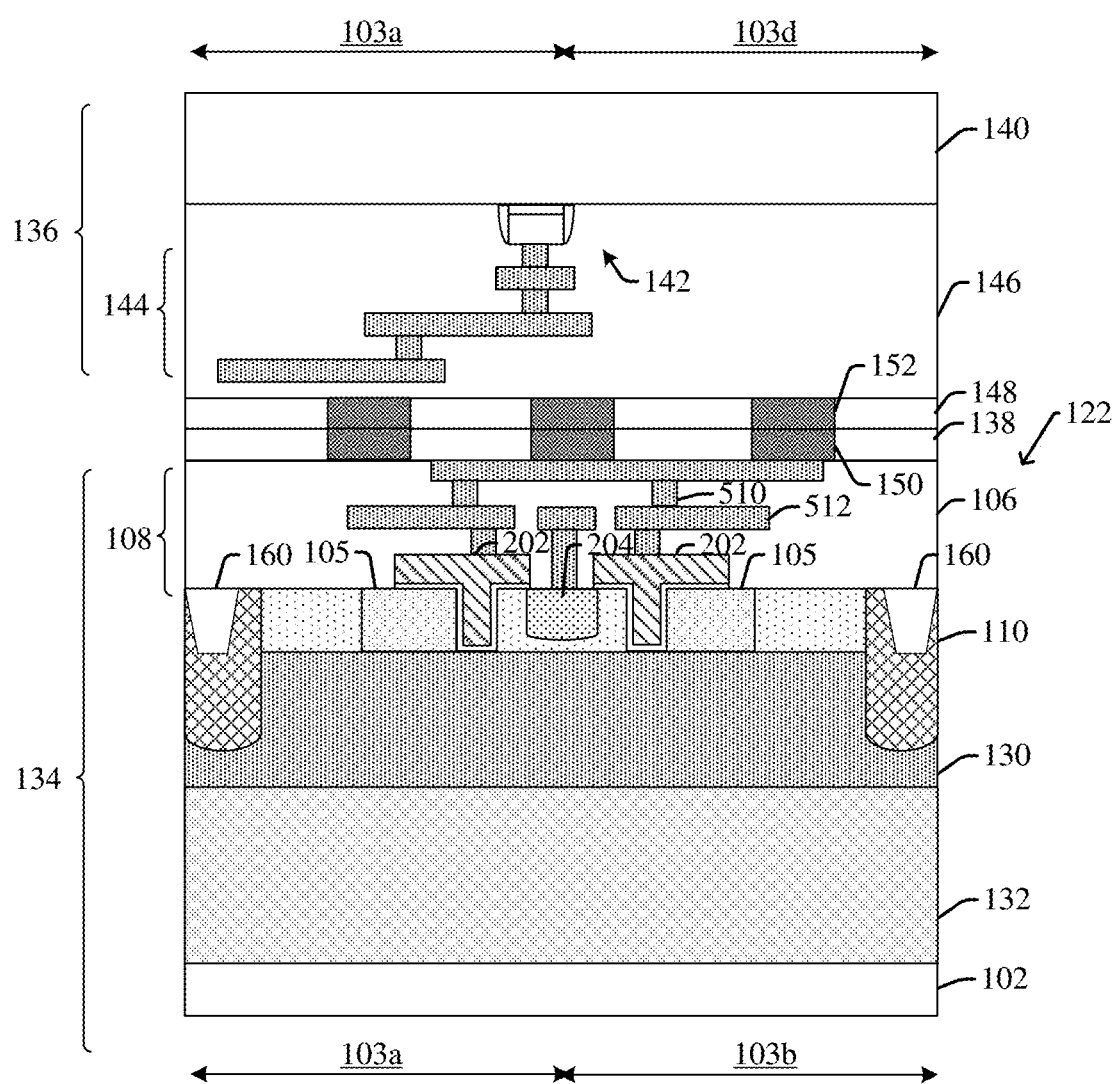

As shown in cross-sectional view 1200 of FIG. 12, in some embodiments, the image sensing die 134 can be then bonded to one or more other dies. For example, the image sensing die 134 can be bonded to a logic die 136 prepared to have logic devices 142. The image sensing die 134 and the logic die 136 may be bonded face to face, face to back, or back to back. For example, the bonding process may use a pair of intermediate bonding dielectric layers 138, 148, and bonding pads 150, 152 to bond the metallization stacks 108, 144 of the image sensing die 134 and the logic die 136. The bonding process may comprise a fusion or a eutectic bonding process. The bonding process may also comprise a hybrid bonding process including metal to metal bonding of the bonding pads 150, 152, and dielectric to dielectric bonding of the intermediate bonding dielectric layers 138, 148. An annealing process may follow the hybrid bonding process, and may be performed at a temperature range between about 250° C. to about 450° for a time in a range of about 0.5 hour to about 4 hours, for example.

Figure 13:
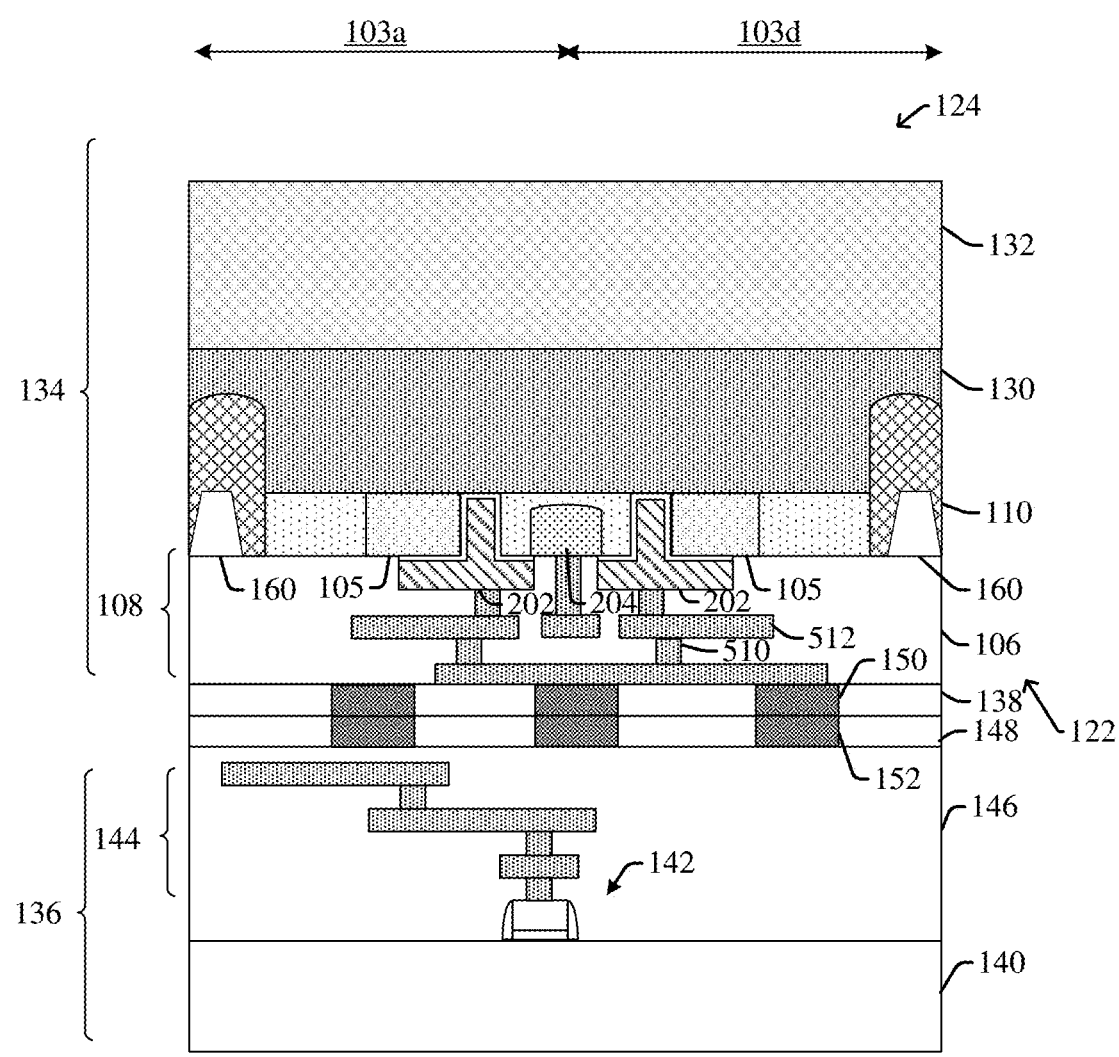

As shown in cross-sectional view 1300 of FIG. 13, in some embodiments, the image sensing die 134 is thinned from a back-side 124 that is opposite to the front-side 122. The thinning process may partially or completely removes the handling substrate 102 (see FIG. 12) and allow for radiation to pass through the back-side 124 of the image sensing die 134 to reach the n-type doped epitaxial layer 132 and the n-type EPI layer 130. The handling substrate 102 may be thinned by etching the back-side 124 of the image sensing die 134. Alternatively, the handling substrate 102 may be thinned by mechanical grinding the back-side 124 of the image sensing die 134. As an example, the handling substrate 102 can be firstly grinded to a thickness range between approximately 17 μm and approximately 45 μm. Then, an aggressive wet etch can be applied to further thin the handling substrate 102. An example of the etchant may include hydrogen nitric/fluoride/acetic acid (HNA). A chemical mechanical process and a tetramethylammonium hydroxide (TMAH)) wet etching may then follow to further thin a thickness range between approximately 2.8 μm and approximately 7.2 μm. In some cases, sufficient etching selectivity is needed between the handling substrate 102 and materials neighboring the handling substrate 102 for an etching process to remove the handling substrate 102 and stop on the neighboring materials. For example, the handling substrate 102 may need to be highly doped when neighboring materials include p-type doped semiconductor material. On the other hand, when the n-type doped epitaxial layer 132 is formed by a blanket deposition process or otherwise covers the entire handling substrate 102, selection of handling substrate 102 is more flexible, and more cost effective lightly doped p-type wafer can be used since it can have sufficient etching selectivity with the n-type doped epitaxial layer 132.

Figure 14:
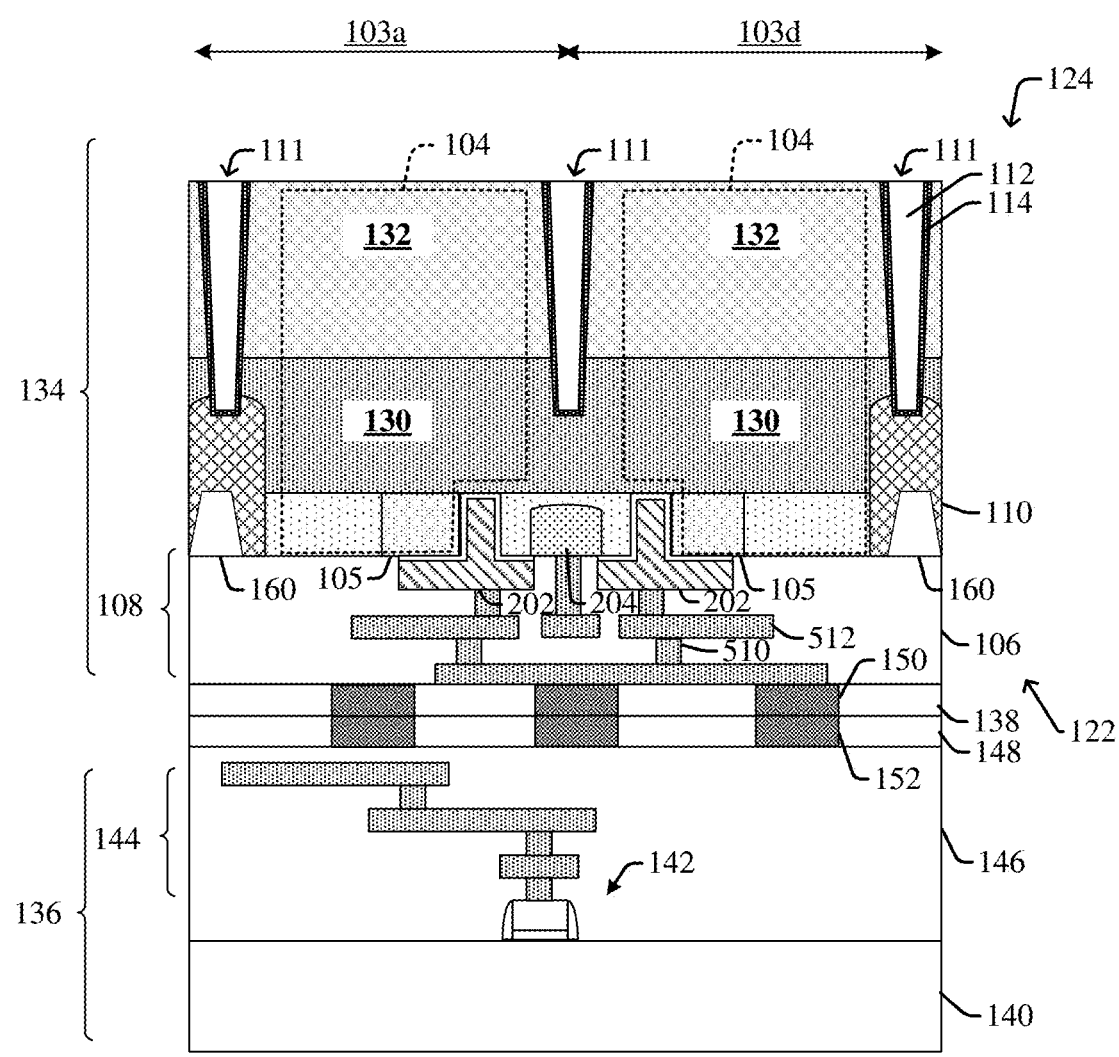

As shown in cross-sectional view 1400 of FIG. 14, in some embodiments, a plurality of DTI structures 111 is formed between the adjacent pixel regions 103a, 103d from the back-side 124 of the image sensing die 134 and extending to a position within the n-type EPI layer 130. In some alternative embodiments, the DTI structures 111 may further extend in vertical depth through the n-type EPI layer 130, such that a complete isolation is achieved. The DTI structures 111 separates the n-type doped epitaxial layer 132 and the n-type EPI layer 130 and forms photodiode structures 104 for respective pixel regions 103a, 103d.

As an example, the plurality of DTI structures 111 may be formed by firstly forming deep trenches using a masking layer. Then, a doped liner 114 is formed along sidewall and bottom surfaces of the plurality of DTI structures 111. The doped liner 114 may be formed by an implantation process or an epitaxial growth process. Processing gases may comprise silane ($SiH_4$), dichlorosilane (DCS, or $H_2SiCl_2$), diborane ($B_2H_6$), hydrogen ($H_2$) or other applicable gases. As an example, a thickness of the doped liner 114 may be in a range between approximately 0.5 nm and approximately 10 nm, and a concentration of boron can be in a range of from about $1\times10^{19}$ $cm^{-3}$ to about $2\times10^{20}$ $cm^{-3}$. A thicker doped liner or a smaller concentration of dopants adversely affects the number of white pixels and/or the dark current of the image sensor. A dopant activation process may be then performed to facilitate diffusion and to form the doped liner 114. Then, dielectric materials may be filled in the remaining spaces of the deep trenches to form the DTI structures 111. As an example, a high-k dielectric liner (not shown) can be formed along the doped liner 114, and a dielectric fill layer 112 can be formed in the recess of the doped high-k dielectric liner to fill a remainder of the deep trenches. In some embodiments, a planarization process is performed after forming the dielectric fill layer 112 to form a planar surface that extends along an upper surface of the dielectric fill layer 112. The doped liner 114, the high-k dielectric liner, and the dielectric fill layer 112 may subject to a planarization process that removes lateral portions of the overlying the dielectric fill layer 112, the high-k dielectric liner, and the doped liner 114 directly overlying pixel regions 103a, 103d.

Figure 15:
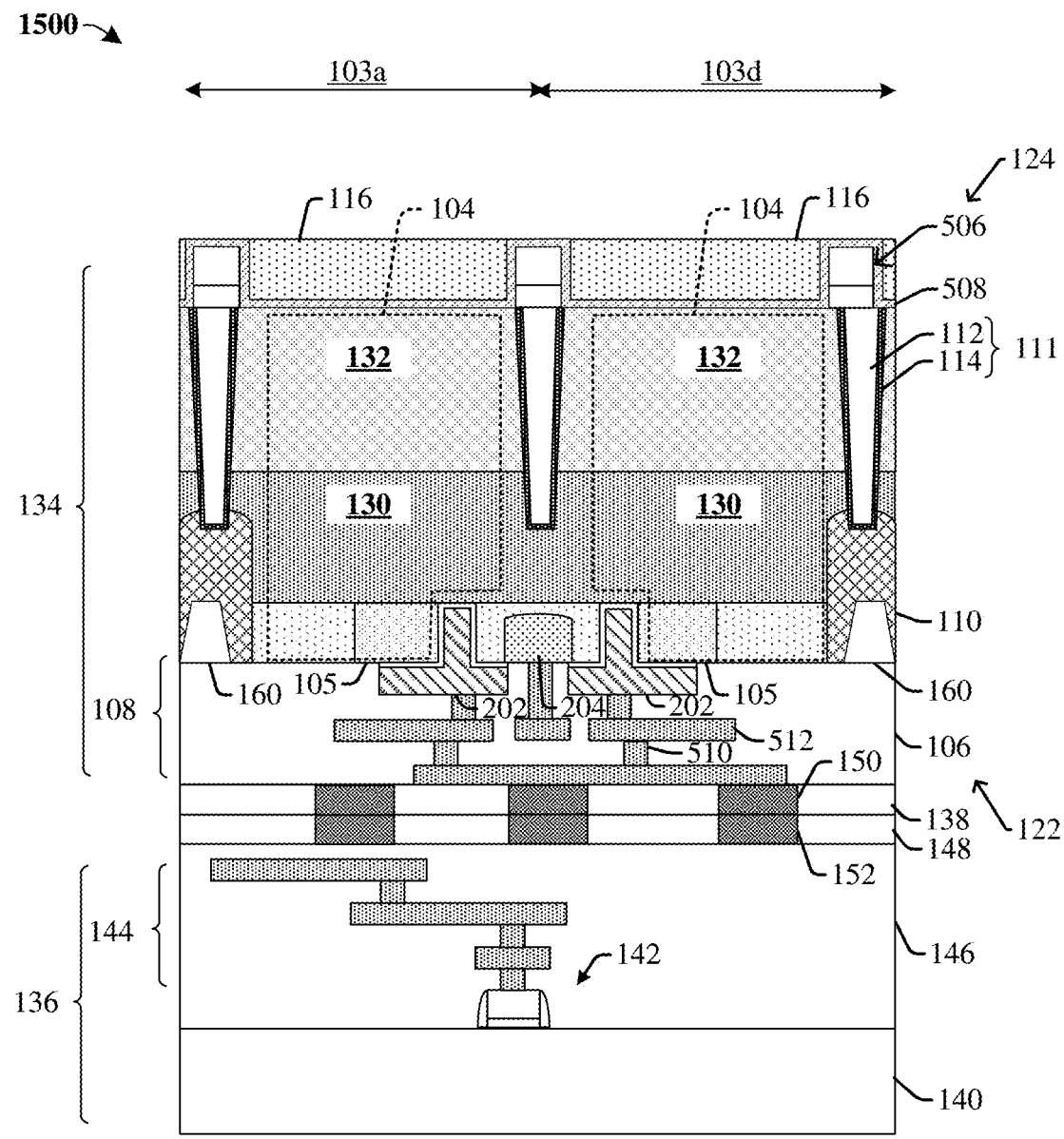

As shown in cross-sectional view 1500 of FIG. 15, in some embodiments, color filters 116 are formed overlying the photodiode structures 104 corresponding to pixel regions 103a, 103d. In some embodiments, a composite grid structure 506 is firstly formed between and overlying pixel regions 103a, 103d. The composite grid structure 506 may comprise metal and dielectric layers stacked at the back-side 124 of the image sensing die 134. A dielectric liner 508 may be formed lining sidewall and top of the composite grid structure 506. Color filter layers are formed over the dielectric liner 508 and within the composite grid structure 506 of materials that allows light of the corresponding color to pass therethrough, while blocking light of other colors. The color filters 116 may be formed with assigned colors. For example, the color filters 116 are alternatingly formed with assigned colors of red, green, and blue. The color filters 116 may be formed with upper surfaces aligned with that of the composite grid structure 506. The color filters 116 may be laterally shifted or offset in at least one direction from the photodiode structures 104 of the corresponding pixel regions. Depending upon the extent of the shift or offset, the color filters 116 may partially fill the openings of the corresponding pixel regions and may partially fill the openings of pixel regions neighboring the corresponding pixel regions. Alternatively, the color filters 116 may be symmetrical about vertical axes aligned with photodiode centers of the corresponding pixel regions. The process for forming the color filters 116 may include, for each of the different colors of the color assignments, forming a color filter layer and patterning the color filter layer. The color filter layer may be planarized subsequent to formation. The patterning may be performed by forming a photoresist layer with a pattern over the color filter layer, applying an etchant to the color filter layer according to the pattern of the photoresist layer, and removing the pattern photoresist layer.

Figure 16:
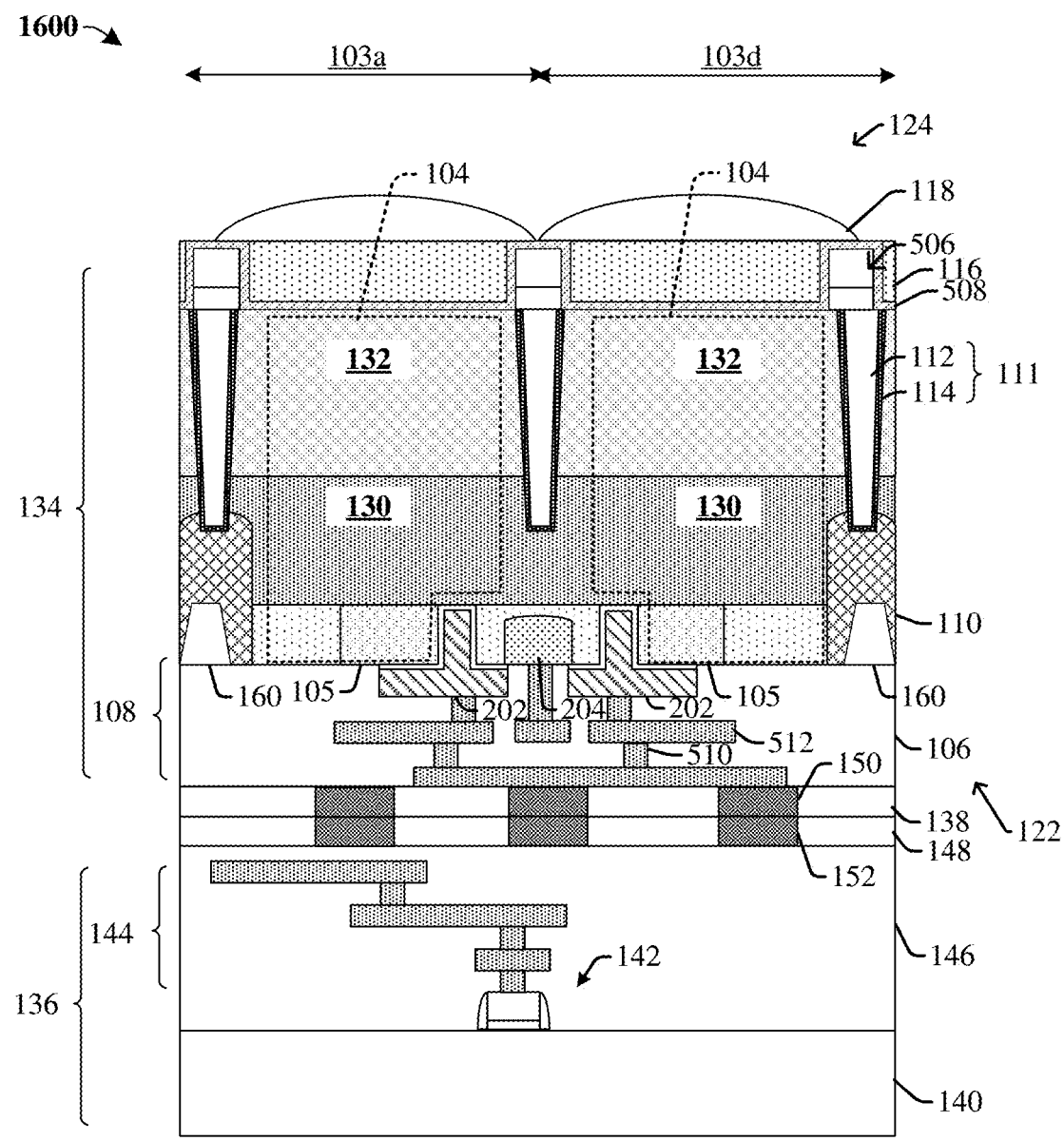

As shown in cross-sectional view 1600 of FIG. 16, micro-lenses 118 corresponding to the pixel regions are formed over the color filters 116 of the corresponding pixel regions. In some embodiments, the plurality of micro-lenses may be formed by depositing a micro-lens material above the plurality of color filters (e.g., by a spin-on method or a deposition process). A micro-lens template having a curved upper surface is patterned above the micro-lens material. In some embodiments, the micro-lens template may comprise a photoresist material exposed using a distributing exposing light dose (e.g., for a negative photoresist more light is exposed at a bottom of the curvature and less light is exposed at a top of the curvature), developed and baked to form a rounding shape. The micro-lenses 118 are then formed by selectively etching the micro-lens material according to the micro-lens template.

Figure 17:
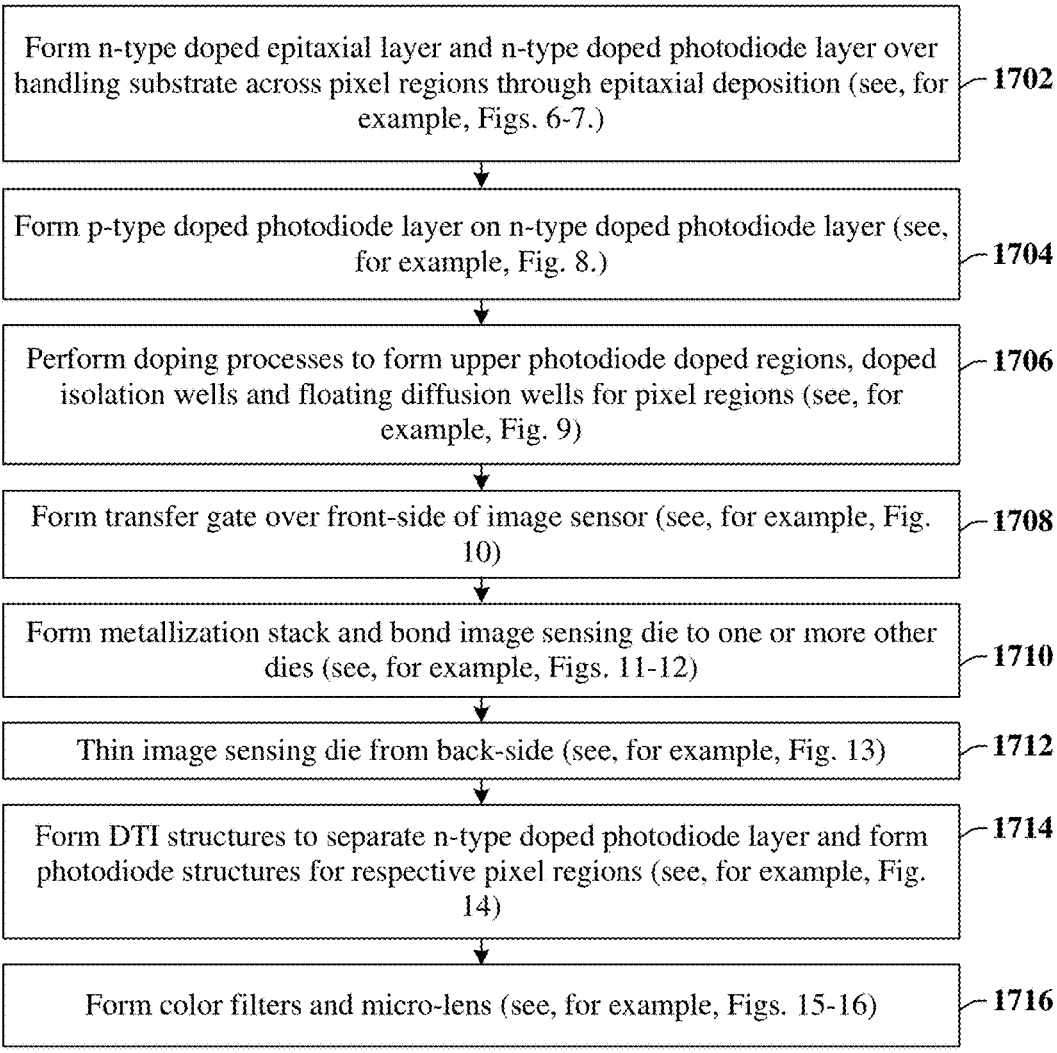
FIG. 17 illustrates a flow diagram of some embodiments of a method of forming an image sensor having an epitaxial deposited photodiode structure.

FIG. 17 illustrates a flow diagram of some embodiments of a method 1700 of forming an image sensor having an epitaxial deposited photodiode structure. While disclosed method 1700 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases At act 1702, a handling substrate is provided for an image sensing die. An n-type doped epitaxial layer is formed over the handling substrate, and an n-type EPI layer is formed on the n-type doped epitaxial layer across a plurality of pixel regions. FIGS. 6-7 illustrate cross-sectional views corresponding to some embodiments corresponding to act 1702.

At act 1704, a p-type EPI layer is formed on the n-type EPI layer. The p-type EPI layer may be formed by a p-type epitaxial process. FIG. 8 illustrates a cross-sectional view corresponding to some embodiments corresponding to act 1704.

At act 1706, a series of doping processes is performed to form a plurality of upper doped photodiode regions, a plurality of doped isolation wells and/or a plurality of floating diffusion wells within the p-type EPI layer. FIG. 9 illustrates a cross-sectional view corresponding to some embodiments corresponding to act 1706.

At act 1708, a plurality of transfer gates is formed over the front-side of the image sensor between the floating diffusion wells and the upper doped photodiode regions. FIG. 10 illustrates a cross-sectional view corresponding to some embodiments corresponding to act 1708.

At act 1710, the image sensing die is bonded to one or more other dies. A metallization stack may be formed overlying the transfer gates before the bonding process. FIGS. 11-12 illustrate cross-sectional views corresponding to some embodiments corresponding to act 1710.

At act 1712, the image sensing die is thinned from a back-side that is opposite to the front-side. FIG. 13 illustrates a cross-sectional view corresponding to some embodiments corresponding to act 1712.

At act 1714, a plurality of deep trench isolation (DTI) structures is formed between the adjacent pixel regions from the back-side of the image sensing die and extending to a position within the n-type EPI layer. The DTI structures separate the n-type doped epitaxial layer and the n-type EPI layer and forms photodiode structures for respective pixel regions. FIG. 14 illustrates a cross-sectional view corresponding to some embodiments corresponding to act 1714.

At act 1716, color filters are formed overlying the photodiode structures, and micro-lenses are formed over the color filters corresponding to the pixel regions. An anti-reflective layer and a composite grid structure may be formed on the back side of the image sensing die before forming the color filters. FIGS. 15-16 illustrate cross-sectional views corresponding to some embodiments corresponding to act 1716.

Therefore, the present disclosure relates to an image sensor having an epitaxial deposited photodiode structure, and an associated method of formation.

In some embodiments, the present disclosure relates to a method of forming an image sensor. A first epitaxial deposition process is performed to form a first doped EPI layer over a substrate. The first doped EPI layer is of a first doping type. Then, a second epitaxial deposition process is performed to form a second doped EPI layer on the first doped EPI layer. The second doped EPI layer is of a second doping type opposite from the first doping type. Then, an isolation structure is formed to separate the first doped EPI layer and the second doped EPI layer as a plurality of photodiode structures within a plurality of pixel regions. The plurality of photodiode structures is configured to convert radiation that enters from a first side of the image sensor into an electrical signal.

In some alternative embodiments, the present disclosure relates to an image sensor. The image sensor comprises a first doped EPI layer of a first doping type and a second doped EPI layer disposed on the first doped EPI layer. The second doped EPI layer is of a second doping type opposite from the first doping type. The image sensor further comprises an isolation structure disposed between adjacent pixel regions of a plurality of pixel regions to separate the first doped EPI layer and the second doped EPI layer to a plurality of photodiode structures that configured to convert radiation that enters from a first side of the image sensor into electrical signal. The first doped EPI layer has a doping concentration monotonically increasing from one side away from the second doped EPI layer to the other side contacting the second doped EPI layer.

In yet other embodiments, the present disclosure relates to an image sensor. The image sensor comprises a plurality of pixel regions of image sensing cells. The image sensor comprises a first doped EPI layer of a first doping type and a second doped EPI layer of a second doping type contacting each other and disposed across the plurality of pixel regions. The second doping type is opposite from the first doping type. The image sensor further comprises a plurality of deep trench isolation (DTI) structures disposed between adjacent pixel regions of the plurality of pixel regions to separate the first doped EPI layer and the second doped EPI layer to a plurality of photodiode structures that configured to convert radiation that enters from a first side of the image sensor into electrical signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an image sensor, comprising:
performing a first epitaxial deposition process to form a first doped EPI layer over a substrate, wherein the first doped EPI layer is of a first doping type;
after the first epitaxial deposition process, performing a second epitaxial deposition process to form a second doped EPI layer on the first doped EPI layer, wherein the second doped EPI layer is of a second doping type opposite from the first doping type;
forming an isolation structure to separate the first doped EPI layer and the second doped EPI layer into a plurality of photodiode structures within a plurality of pixel regions, wherein the plurality of photodiode structures are configured to convert radiation that enters from a first side of the image sensor into an electrical signal; and
after the second epitaxial deposition process, forming an upper doped photodiode region by an implantation process in the second doped EPI layer, wherein the upper doped photodiode region is of the first doping type, wherein an upper surface of the upper doped photodiode region is co-planar with an upper surface of the second doped EPI layer,
wherein the upper doped photodiode region has a doping concentration increasing and then decreasing in a vertical direction from one side of the second doped EPI layer away from the first doped EPI layer to an opposite side of the second doped EPI layer contacting the first doped EPI layer.

2. The method of claim 1, wherein the first doped EPI layer is formed by forming a stack of epitaxial layers with doping concentrations monotonically increasing from bottom to top, wherein the upper surface of the second doped EPI layer is flush with an upper surface of the isolation structure.

3. The method of claim 1, prior to forming the first doped EPI layer, further comprising performing an epitaxial deposition process to form a doped epitaxial layer of the first doping type over the substrate, wherein the doped epitaxial layer has a doping concentration smaller than that of the first doped EPI layer.

4. The method of claim 1, wherein the formation of the isolation structure comprises forming a plurality of deep trench isolation (DTI) structures from the first side of the image sensor and extending to a position within the first doped EPI layer.

5. The method of claim 4, wherein the formation of the plurality of DTI structures comprises:
forming a plurality of deep trenches between adjacent pixel regions and vertically extending from the first side of the image sensor to the first doped EPI layer;
forming a doped liner with the second doping type lining sidewalls of the deep trenches; and
forming a dielectric layer filling inner spaces of the deep trenches between sidewalls of the doped liner.

6. The method of claim 4, wherein the formation of the isolation structure comprises forming a plurality of doped isolation wells of the second doping type extending from a second side of the image sensor opposite to the first side, wherein the plurality of doped isolation wells directly contact the plurality of DTI structures and the first doped EPI layer.

7. The method of claim 1, wherein the substrate is of the second doping type, wherein sidewall surfaces of the upper doped photodiode region are between sidewall surfaces of the second doped EPI layer.

8. A method for forming an image sensor, comprising:
performing a first doping process while a first epitaxial deposition process is performed to form a first doped EPI layer of a first doping type over a substrate;
subsequently, performing a second doping process while a second epitaxial deposition process is performed to form a second doped EPI layer on the first doped EPI layer, wherein the second doped EPI layer is of a second doping type opposite from the first doping type, and wherein the second epitaxial deposition process is different from the first epitaxial deposition process;
forming an isolation structure between adjacent pixel regions of a plurality of pixel regions to separate the first doped EPI layer and the second doped EPI layer to a plurality of photodiode structures that configured to convert radiation that enters from a first side of the image sensor into electrical signal; and
performing an additional implantation process to form a plurality of upper doped photodiode regions of the first doping type with sidewall surfaces within the second doped EPI layer;
wherein the plurality of upper doped photodiode regions has a doping concentration increasing and then decreasing in a vertical direction from one side of the second doped EPI layer away from the first doped EPI layer to an opposite side of the second doped EPI layer contacting the first doped EPI layer.

9. The method of claim 8, wherein the isolation structure is formed by forming a deep trench extending from the first side of the image sensor to a first position within the first doped EPI layer followed by filling the deep trench to form a plurality of deep trench isolation (DTI) structures.

10. The method of claim 9, wherein forming the plurality of DTI structures comprises forming a doped liner of the second doping type directly contacting the first doped EPI layer.

11. The method of claim 10, wherein forming the plurality of DTI structures further comprises forming a high-k dielectric liner along the doped liner and forming a dielectric layer between opposing sidewalls of the high-k dielectric liner.

12. The method of claim 11,
wherein forming the isolation structure further comprises forming a plurality of doped isolation wells of the second doping type extending from a second side of the image sensor opposite to the first side to a second position within the first doped EPI layer; and
wherein the plurality of doped isolation wells directly contact the DTI structures and the first doped EPI layer.

13. The method of claim 10, wherein the first doped EPI layer has a doping concentration monotonically increasing from one side of the first doped EPI layer away from the second doped EPI layer to an opposite side of the first doped EPI layer contacting the second doped EPI layer.

14. A method for forming an image sensor, comprising:
performing a first doping process while performing a first epitaxial deposition process to form a first doped EPI layer of a first doping type;
after forming the first doped EPI layer, performing a second doping process while performing a second epitaxial deposition process to form a second doped EPI layer of a second doping type over the first doped EPI layer, the second doping type being opposite from the first doping type;

forming a plurality of deep trench isolation (DTI) structures between adjacent pixel regions of a plurality of pixel regions to separate the first doped EPI layer and the second doped EPI layer into a plurality of photodiode structures that are configured to convert radiation that enters from a first side of the image sensor into electrical signal;

forming a plurality of doped isolation wells of the second doping type between the adjacent pixel regions of the plurality of pixel regions, wherein sidewalls of the doped isolation wells contact the first doped EPI layer and the second doped EPI layer, wherein the DTI structures protrude into the doped isolation wells through a plurality of bottom surfaces of the doped isolation wells; and performing an implantation process to dope an upper doped photodiode region in the second doped EPI layer with the first doping type, wherein a bottom surface of the upper doped photodiode region is directly contacting the first doped EPI layer.

15. The method of claim 14, wherein the first doped EPI layer is formed directly contacting sidewalls of the DTI structures.

16. The method of claim 15, wherein the DTI structures directly contact the doped isolation wells.

17. The method of claim 8, further comprising:

performing an additional epitaxial deposition process to form a doped epitaxial layer of the first doping type prior to the first epitaxial deposition process, wherein the doped epitaxial layer has a doping concentration monotonically increasing from one side away from the first doped EPI layer to another side contacting the first doped EPI layer, and wherein a step increase presents between the doped epitaxial layer and the first doped EPI layer in a direction congruent with the doping concentration monotonically increasing.

18. The method of claim 14, wherein a portion of a transfer gate overlies the upper doped photodiode region.

19. The method of claim 1, wherein the upper doped photodiode region has a bottom surface directly contacting an upper surface of the first doped EPI layer.

20. The method of claim 4, wherein the formation of the isolation structure comprises forming a plurality of doped isolation wells of the second doping type extending from a second side of the image sensor opposite to the first side, wherein sidewalls of the doped isolation wells directly contact the plurality of DTI structures and the first doped EPI layer.

* * * * *